US009570609B2

United States Patent
Obradovic et al.

(10) Patent No.: US 9,570,609 B2
(45) Date of Patent: Feb. 14, 2017

(54) CRYSTALLINE MULTIPLE-NANOSHEET STRAINED CHANNEL FETS AND METHODS OF FABRICATING THE SAME

(71) Applicants: Borna J. Obradovic, Leander, TX (US); Robert C. Bowen, Austin, TX (US); Mark S. Rodder, Dallas, TX (US)

(72) Inventors: Borna J. Obradovic, Leander, TX (US); Robert C. Bowen, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/729,652

(22) Filed: Jun. 3, 2015

(65) Prior Publication Data

US 2015/0295084 A1 Oct. 15, 2015

Related U.S. Application Data

(63) Continuation-in-part of application No. 14/270,690, filed on May 6, 2014.
(Continued)

(51) Int. Cl.
*H01L 29/78* (2006.01)
*H01L 29/49* (2006.01)
(Continued)

(52) U.S. Cl.
CPC .......... *H01L 29/7845* (2013.01); *B82Y 40/00* (2013.01); *H01L 29/0673* (2013.01); *H01L 29/20* (2013.01);
(Continued)

(58) Field of Classification Search
CPC .. H01L 29/785; H01L 29/786; H01L 29/7856; H01L 29/7845; H01L 29/42392; H01L 29/517; H01L 29/0673; H01L 29/78696; H01L 29/20; H01L 29/775; H01L 29/78681; B82Y 40/00
(Continued)

(56) References Cited

U.S. PATENT DOCUMENTS

| 5,430,310 A | 7/1995 | Shibasaki et al. |
| 5,461,250 A | 10/1995 | Burghartz et al. |

(Continued)

FOREIGN PATENT DOCUMENTS

| CN | 102194884 A | 9/2011 |
| EP | 1 188 188 B1 | 8/2005 |

(Continued)

OTHER PUBLICATIONS

Cai et al. "III-Nitride metal-insulator-semiconductior heterojunction field-effect transistors using sputtered AlON thin film", Applied Physics Letters, vol. 86, p. 032109 (2005).
(Continued)

*Primary Examiner* — Cuong Q Nguyen
*Assistant Examiner* — Tong-Ho Kim
(74) *Attorney, Agent, or Firm* — Myers Bigel, P.A.

(57) ABSTRACT

A field effect transistor includes a body layer having a strained crystalline semiconductor channel region, and a gate stack on the channel region. The gate stack includes a crystalline semiconductor gate layer that is lattice mismatched with the channel region, and a crystalline gate dielectric layer between the gate layer and the channel region. Related devices and fabrication methods are also discussed.

20 Claims, 17 Drawing Sheets

Related U.S. Application Data

(60) Provisional application No. 62/010,585, filed on Jun. 11, 2014, provisional application No. 61/898,815, filed on Nov. 1, 2013.

(51) Int. Cl.
| | |
|---|---|
| *H01L 29/423* | (2006.01) |
| *H01L 29/51* | (2006.01) |
| *H01L 29/786* | (2006.01) |
| *H01L 29/20* | (2006.01) |
| *B82Y 40/00* | (2011.01) |
| *H01L 29/775* | (2006.01) |
| *H01L 29/06* | (2006.01) |

(52) U.S. Cl.
CPC ....... *H01L 29/42392* (2013.01); *H01L 29/517* (2013.01); *H01L 29/775* (2013.01); *H01L 29/785* (2013.01); *H01L 29/78681* (2013.01); *H01L 29/78696* (2013.01)

(58) Field of Classification Search
USPC .............. 257/410, 194, 330, 288, 213, 347
See application file for complete search history.

(56) References Cited

U.S. PATENT DOCUMENTS

| | | |
|---|---|---|
| 6,603,156 B2 | 8/2003 | Rim |
| 7,029,964 B2 | 4/2006 | Cheng et al. |
| 7,112,832 B2 | 9/2006 | Orlowski et al. |
| 7,262,465 B2 | 8/2007 | Hatada et al. |
| 7,276,723 B2 | 10/2007 | Fathimulla et al. |
| 7,402,483 B2 | 7/2008 | Yun et al. |
| 7,416,957 B2 | 8/2008 | Ponomarev |
| 7,427,788 B2 | 9/2008 | Li et al. |
| 7,476,930 B2 | 1/2009 | Allibert et al. |
| 7,795,687 B2 | 9/2010 | Suk et al. |
| 7,973,336 B2 | 7/2011 | Savage et al. |
| 8,183,627 B2 | 5/2012 | Currie |
| 8,183,667 B2 | 5/2012 | Park |
| 8,236,626 B2 | 8/2012 | Dai et al. |
| 8,247,806 B2 | 8/2012 | Chae et al. |
| 8,293,608 B2 | 10/2012 | Orlowski et al. |
| 8,309,986 B2 | 11/2012 | Lochtefeld |
| 8,329,541 B2 | 12/2012 | Ye et al. |
| 8,362,604 B2 | 1/2013 | Ionescu |
| 8,384,122 B1 | 2/2013 | Hu et al. |
| 8,404,545 B2 | 3/2013 | Vandenberghe et al. |
| 8,421,165 B2 | 4/2013 | Loh et al. |
| 8,436,422 B2 | 5/2013 | Loh et al. |
| 8,440,517 B2 | 5/2013 | Lin et al. |
| 8,530,884 B2 | 9/2013 | Datta et al. |
| 8,686,402 B2 | 4/2014 | Goel et al. |
| 8,754,470 B1 | 6/2014 | Chuang et al. |
| 8,766,353 B2 | 7/2014 | Doris et al. |
| 8,768,271 B1 | 7/2014 | Then et al. |
| 8,809,987 B2 | 8/2014 | Chen et al. |
| 8,816,326 B2 | 8/2014 | Yin et al. |
| 8,937,299 B2 * | 1/2015 | Basu ................ H01L 29/66795 257/24 |
| 2001/0013621 A1 | 8/2001 | Nakazato |
| 2002/0109135 A1 | 8/2002 | Murota et al. |
| 2008/0135949 A1 | 6/2008 | Lo et al. |
| 2008/0224183 A1 * | 9/2008 | Nawaz ............. H01L 29/66795 257/279 |
| 2009/0008630 A1 | 1/2009 | Hurkx et al. |
| 2009/0212324 A1 | 8/2009 | Tamai et al. |
| 2010/0038679 A1 | 2/2010 | Chan et al. |
| 2012/0153352 A1 | 6/2012 | Dewey et al. |
| 2012/0193679 A1 | 8/2012 | Chen et al. |
| 2012/0223390 A1 | 9/2012 | Liang et al. |
| 2012/0292665 A1 * | 11/2012 | Marino ............... H01L 29/1029 257/194 |
| 2013/0093497 A1 | 4/2013 | Lee et al. |
| 2013/0119395 A1 | 5/2013 | Bhuwalka et al. |
| 2013/0181263 A1 * | 7/2013 | Cai ................ H01L 29/66795 257/288 |
| 2013/0200433 A1 | 8/2013 | Adam et al. |
| 2014/0034962 A1 | 2/2014 | Curatola et al. |
| 2014/0138744 A1 | 5/2014 | Kotlyar et al. |
| 2014/0197459 A1 | 7/2014 | Kis et al. |
| 2014/0203350 A1 | 7/2014 | Chuang et al. |
| 2014/0273418 A1 * | 9/2014 | Cheng ............... H01L 29/66484 438/479 |
| 2014/0346573 A1 * | 11/2014 | Adam ............... H01L 21/28008 257/288 |
| 2015/0179788 A1 | 6/2015 | Teramoto |

FOREIGN PATENT DOCUMENTS

| | | |
|---|---|---|
| WO | WO 2013/095346 A1 | 6/2013 |
| WO | WO 2013/095851 | 6/2013 |
| WO | WO 2013/101001 A1 | 7/2013 |
| WO | WO 2013/101172 A1 | 7/2013 |
| WO | WO 2014/064737 | 5/2014 |

OTHER PUBLICATIONS

Ionescu A.M. et al. "Tunnel field-effect transistors as energy-efficient electronic switches", *Nature*, vol. 479, No. 7373, pp. 329-337, Nov. 16, 2011.

Lu Y. et al. "Performance of AlGaSb/InAs TFETs With Gate Electric Field and Tunneling Direction Aligned", *Electron Device Letters*, vol. 33, No. 5, pp. 655-657, May 2012.

Moselund K.E. et al. "InAs—Si Nanowire Heterojunction Tunnel FETs", *Electron Device Letters*, vol. 33, No. 10, pp. 1453-1455, Oct. 2012.

Register L.F. et al. "Stepped Broken-Gap Heterobarrier Tunneling Field-Effect Transistor for Ultralow Power and High Speed", *Electron Device Letters*, vol. 32, No. 6, pp. 743-745, Jun. 2011.

Gil, Bernard, "*III-Nitride Semiconductors and Their Modern Devices*," Oxford University Press, 2013, p. 384.

* cited by examiner

CRYSTALLINE MULTIPLE-NANOSHEET STRAINED CHANNEL FETS AND METHODS OF FABRICATING THE SAME

CLAIM OF PRIORITY

This application is a continuation-in-part of U.S. patent application Ser. No. 14/270,690 entitled "Crystalline Multiple-Nanosheet III-V Channel FETs and Methods of Fabricating the Same" filed on May 6, 2014, which claims priority from U.S. Provisional Patent Application No. 61/898,815 entitled "Fully-Crystalline Multiple-Nanosheet III-V Channel MOSFET" filed on Nov. 1, 2013, the disclosure of which is incorporated by reference herein in its entirety. This application also claims priority from U.S. Provisional Patent Application No. 62/010,585 entitled "A Fully Crystalline Multiple-Nanosheet Strained Si/SiGe Channel MOSFET" filed on Jun. 11, 2014, the disclosure of which is incorporated by reference herein in its entirety.

BACKGROUND

The present inventive concepts relate to semiconductor devices, and more particularly, to semiconductor field effect transistor devices.

III-V semiconductor-based MOSFETs including III-V channel materials may have good CV/I characteristics and relatively high current at low voltages. This may be attributable to the relatively high mobility achievable in the channel, as well as the relatively low parasitic resistance for some semiconductor/metal combinations. The high mobility may be attributed at least in part to the relatively low electron effective mass. Due to the isotropic nature of the effective mass in many III-V semiconductors, the quantum-confinement mass may also be small, which may result in electron wavefunctions that may be broad and may penetrate into the gate dielectric layer(s) surrounding the channel. The gate dielectric layer(s) may be non-crystalline layers on the channel and/or may separate the channel from a non-crystalline gate electrode. The presence of such non-crystalline layers on the surface of the typically crystalline channel may result in carrier scattering (typically referred to as surface roughness (SR) scattering), which may limit the mobility of confined electrons.

Some III-V semiconductor-based MOSFETs including III-V channel materials may include crystalline buffer layers, such as indium phosphide (InP), around the channel. The crystalline buffer layer(s) may have a thickness that is sufficient to separate the crystalline channel from the non-crystalline layers and help reduce carrier scattering. However, such buffer layers may degrade the short-channel performance of the device, due to the increased separation of the gate electrode and the channel inversion layer. Thus, the use of crystalline buffer layers may limit the use of III-V MOSFETs to relatively long gate lengths (for example, greater than about 40 nm).

Group IV semiconductor-based MOSFETs, such as Si and SiGe nanosheet transistors, may be an option for sub-10 nm technologies, for example, due to improved electrostatics (relative to finFETs) and stackability of nanosheets. However, improving DC performance relative to finFETs may require relatively wide nanosheets to achieve sufficient $I_{eff}$ in the desired layout area, and with a desired number of stacked nanosheet layers. This may present processing difficulties, as highly selective etching may be required to undercut one type of nanosheet (e.g. Si or SiGe) relative to the other type of nanosheet (e.g. SiGe or Si), to create desired conduction channels formed with the desired type of nanosheet material. Additionally, the etching process may temporarily create free surfaces around the nanosheets, causing any built-in strain to relax, which can limit the performance of the nanosheets.

SUMMARY

According to some embodiments of the inventive concepts, a field effect transistor includes a nanosheet stack having a plurality of individually gated conduction channels. The individually gated conduction channels respectively include a crystalline semiconductor channel layer, a crystalline gate dielectric layer on the channel layer, and a crystalline semiconductor gate layer on the gate dielectric layer opposite the channel layer. The nanosheet stack is strained from lattice mismatch between ones of the layers thereof.

In some embodiments, the crystalline channel layer, the crystalline gate dielectric layer, and the crystalline gate layer may be heteroepitaxial layers.

In some embodiments, the field effect transistor may be an n-type device, and the crystalline channel layer comprises silicon (Si).

In some embodiments, the field effect transistor may be a p-type device, and the crystalline channel layer comprises silicon germanium (SiGe).

In some embodiments, the crystalline dielectric layer may be calcium fluoride ($CaF_2$), zinc sulfide (ZnS), praseodymium oxide ($Pr_2O_3$), and/or gadolinium oxide ($Gd_2O_3$).

In some embodiments, the field effect transistor may be an n-type device, and the crystalline gate layer may be doped silicon germanium (SiGe).

In some embodiments, the field effect transistor may be a p-type device, and the crystalline gate layer may be doped silicon (Si).

According to further embodiments of the inventive concepts, a field effect transistor includes a body layer including a crystalline semiconductor channel region, and a gate stack on the channel region. The gate stack includes a crystalline semiconductor gate layer that is lattice mismatched with the channel region, and a crystalline gate dielectric layer between the gate layer and the channel region.

In some embodiments, an interface between the channel region and the gate stack may be free of amorphous materials. For example, the gate dielectric layer may be a high-k crystalline insulating layer directly on the channel region.

In some embodiments, the gate layer may be directly on the gate dielectric layer. The channel region and the gate layer may be heteroepitaxial strained semiconductor layers.

In some embodiments, the channel region and the gate layer may be different Group IV materials, and the gate layer may be heavily doped relative to the channel region.

In some embodiments, one of the channel region and, the gate layer may be compressively strained silicon germanium (SiGe), and another of the channel region and the gate layer may be tensile strained silicon (Si).

In some embodiments, the gate layer may include respective crystalline semiconductor gate layers on opposing surfaces of the channel region, and the gate dielectric layer may include respective gate dielectric layers between the respective gate layers and the opposing surfaces of the channel region.

In some embodiments, a structure including the gate stack and the body layer may be repeatedly stacked to define a plurality of individually-gated channel regions, and strain in the channel regions and the gate layers may be maintained throughout the structure.

In some embodiments, the structure may have a width of greater than about 30 nanometers but less than about 100 nanometers. The channel region may be separated from the gate layer by the gate dielectric layer having a thickness of less than about 3 nanometers. The channel regions and/or the gate layers may have respective thicknesses of less than about 10 nanometers in some embodiments.

In some embodiments, the respective gate layers on the opposing surfaces of the channel region may be primary gate layers. A secondary gate layer may be provided on at least one sidewall of the channel region between the opposing surfaces thereof. The secondary gate layer may be formed of a metal material or a doped polycrystalline material.

In some embodiments, the plurality of individually-gated channel regions may define a fin protruding from a substrate, and the secondary gate layer may extend on opposing sidewalls of the fin and on a surface therebetween.

In some embodiments, an amorphous insulating layer may separate sidewalls of the channel region from the secondary gate layer, and the secondary gate layer may be conductively coupled to all of the primary gate layers.

In some embodiments, source/drain regions may be provided on opposite ends of and conductively coupled to the channel region and adjacent the gate stack thereon. Amorphous insulating layers may separate opposing sidewalls of the gate layer from the source/drain regions.

According to still further embodiments of the inventive concepts, a method of fabricating a field effect transistor includes providing a body layer including a crystalline semiconductor channel region, and providing a gate stack on the channel region. The gate stack includes a crystalline semiconductor gate layer that is lattice mismatched with the channel region, and a crystalline gate dielectric layer between the gate layer and the channel region.

In some embodiments, the gate dielectric layer may be a high-k crystalline semiconductor layer formed directly on the channel region. The channel region and the gate layer may be strained semiconductor layers.

In some embodiments, the channel region, the gate dielectric layer, and the gate layer may be formed by heteroepitaxial growth.

In some embodiments, the channel region and the gate layer may be formed of different Group IV materials, and the gate layer may be heavily doped relative to the channel region.

In some embodiments, one of the channel region and the gate layer may be compressively strained silicon germanium (SiGe), and another of the channel region and the gate layer may be tensile strained silicon (Si).

In some embodiments, in providing the gate stack, respective gate dielectric layers and respective gate layers thereon may be formed on opposing surfaces of the channel region.

In some embodiments, providing the gate stack and the body layer may include forming a structure comprising the gate stack and the body layer repeatedly stacked to define a plurality of individually-gated channel regions.

In some embodiments, the respective gate layers on the opposing surfaces of the channel region may be primary gate layers, and a secondary gate layer may be formed on at least one sidewall of the channel region between the opposing surfaces thereof. The secondary gate layer may be formed of a metal material or doped polycrystalline material.

In some embodiments, the plurality of individually-gated channel regions may define a fin protruding from a substrate, and the secondary gate layer may be formed on opposing sidewalls of the fin and on a surface therebetween.

In some embodiments, prior to forming the secondary gate layer, the sidewalls of the channel region may be selectively recessed to define recesses therein, and amorphous insulating layers may be formed in the recesses in the sidewalls of the channel region. The amorphous insulating layers may separate the channel region from the secondary gate layer.

In some embodiments, opposing sidewalls of the primary gate layers may be selectively recessed to define respective recessed regions therein, and amorphous insulating layers may be formed in the respective recessed regions. Source/drain regions may be epitaxially grown from opposite ends of the channel region, and the amorphous insulating layers may separate the opposing sidewalls of the primary gate layers from the source/drain regions.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Aspects of the present disclosure are illustrated by way of example and are not limited by the accompanying FIGS. with like references indicating like elements.

DETAILED DESCRIPTION

Figure 1A:
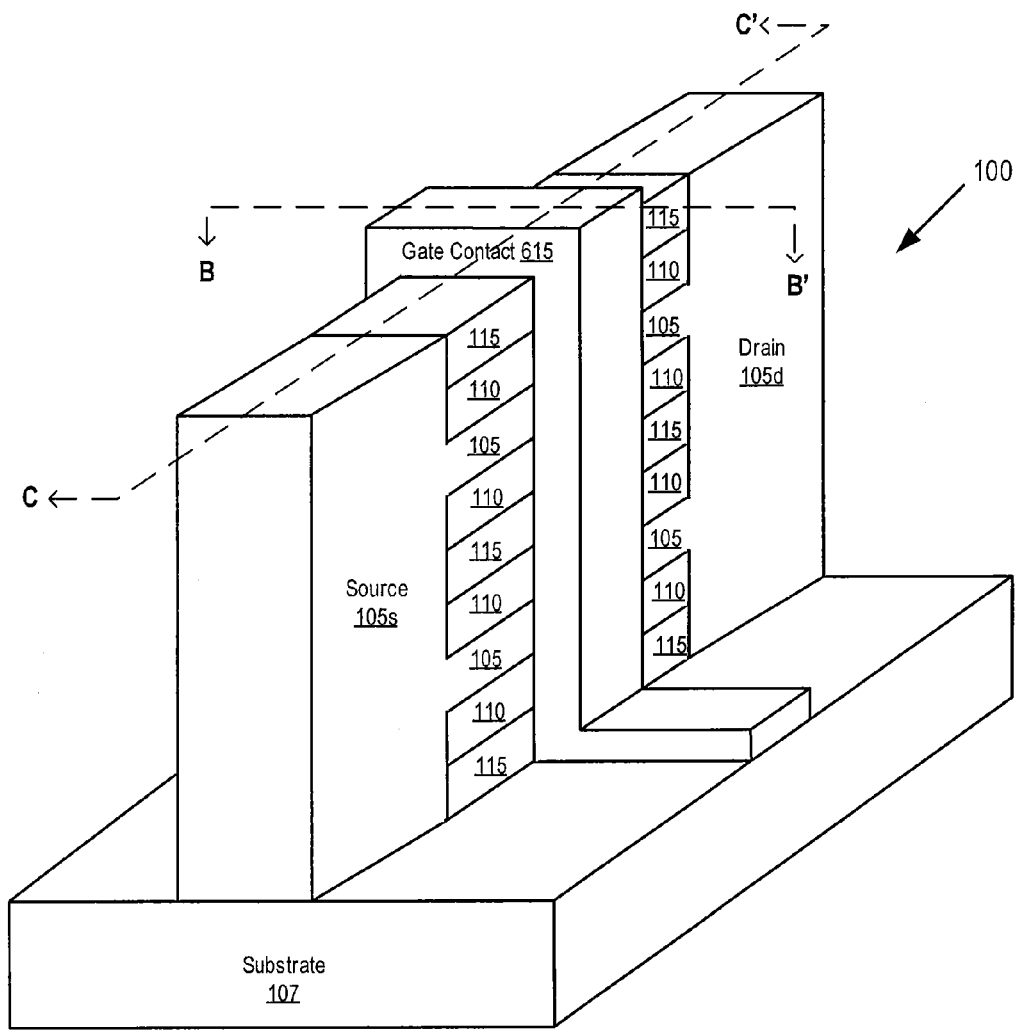
FIG. 1A is a perspective view illustrating FETs having crystalline channel, dielectric, and gate layers in accordance with some embodiments of the present inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions are not shown to scale, and in some instances may be exaggerated for clarity.

The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Some embodiments of the inventive concepts arise from a realization that the use of crystalline buffer materials on and/or around the channel region may suppress SR scattering at the expense of short channel performance, introducing a tradeoff between mobility and short-channel performance in III-V MOSFETs. Some embodiments of the inventive concepts provide a III-V FET structure which reduces and/or eliminates this tradeoff to improve the potential of III-V FETs.

In particular, some embodiments of the inventive concepts introduce a III-V channel FET in which the channel layer and gate stack are formed substantially or entirely of monocrystalline, lattice matched semiconductors. For example, the gate stack may include a II-VI wide bandgap, high-k (i.e., having a high dielectric constant relative to silicon dioxide) semiconductor as the gate dielectric layer, and a moderate bandgap III-V semiconductor as the gate layer. In some embodiments, the channel material is indium arsenide (InAs), the gate dielectric material is zinc telluride (ZnTe), and the gate material is aluminum antimonide (AlSb). Multiple channel layers (and multiple gate stacks) may be formed, for example, as determined by or otherwise based on a targeted current-carrying capacity requirement of the device. Each channel layer may be gated from above and below by heavily doped AlSb layers. A ZnTe gate dielectric layer may be provided between each channel layer and the adjacent gate layers. The channel/dielectric/gate stacks may be arranged in thin layers (having respective widths greater than respective thicknesses thereof), hereafter referred to as nanosheets. The overall structure may provide a FET with high channel mobility (e.g., due to reduction or minimization of surface roughness (SR) scattering), good short-channel behavior (e.g., due to the absence of conductive buffer layers further separating the channel from non-crystalline layers, thus keeping inversion layers close to the gates), and low parasitic resistance (e.g., due to high conductivity of doped InAs and low contact resistance for n-contacts), suitable for use in 7 nm technologies and beyond.

Figure 1B:
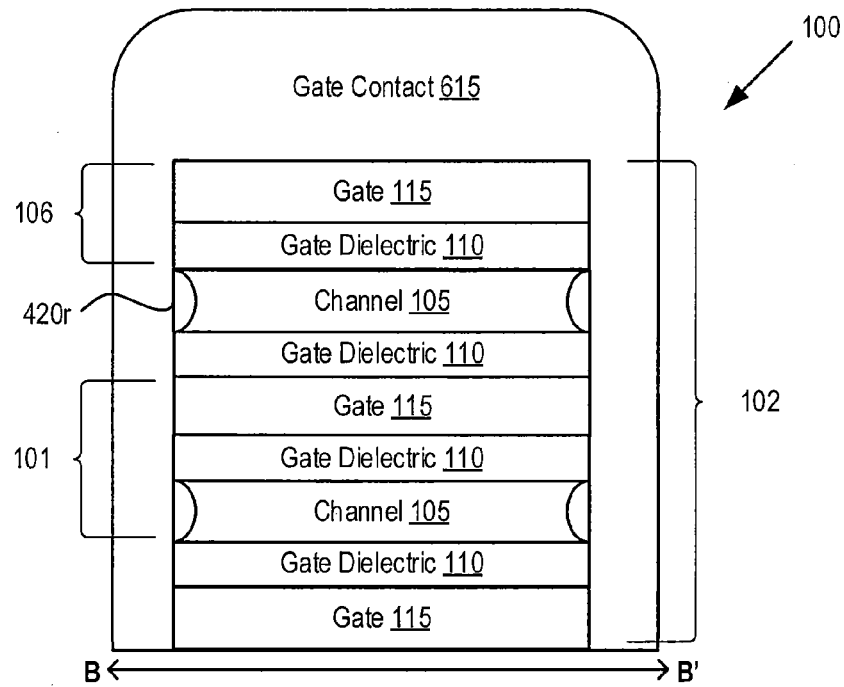
FIGS. 1B and 1C are cross sectional views taken along lines B-B' and C-C' of FIG. 1A, respectively.
Figure 1C:
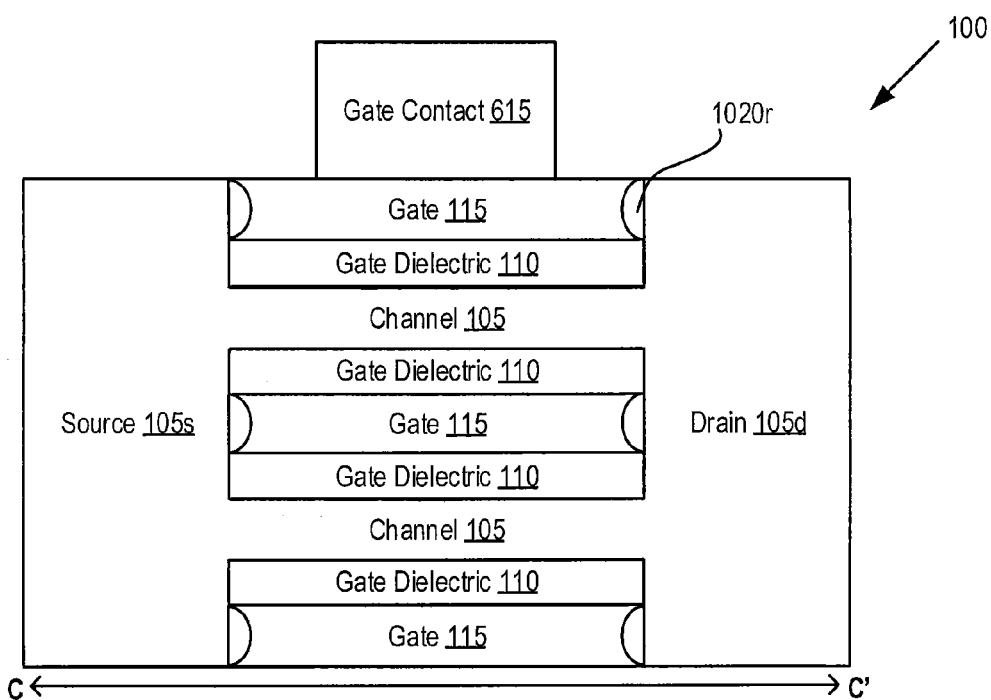

FIG. 1A is a perspective view illustrating FET devices including a crystalline channel, gate, and dielectric layers in accordance with some embodiments of the present inventive concepts, while FIGS. 1B and 1C are cross sectional views taken along lines B-B' and C-C' of FIG. 1A, respectively. As shown in FIGS. 1A-1C, a field effect transistor (FET) 100 in accordance with some embodiments of the present inventive concepts includes a structure 102 having a semiconductor active or body layer defining a transistor channel layer or region 105, and a semiconductor gate stack 106 on the channel region 105. The gate stack 106 includes a crystalline gate dielectric layer 110 and a crystalline gate layer 115 (also referred to herein as a primary gate layer or first gate electrode) thereon. The crystalline gate dielectric layer 110 may be a high-k, wide bandgap semiconductor, while the crystalline gate layer 115 may be a moderate bandgap semiconductor with high dopant activation. For example, the structure may include an indium arsenide (InAs) channel region 105, a zinc telluride (ZnTe) gate dielectric layer 110, and a highly-doped aluminum antimonide (AlSb) gate layer 115, all of which may be monocrystalline in some embodiments.

The channel region 105 is a crystalline semiconductor layer extending between source and drain regions 105s and 105d on opposite sides thereof. The source/drain regions 105s/105d may be highly doped, resulting in low contact resistance. The source/drain regions 105s/105d may also be formed of crystalline semiconductor materials, and may be formed of the same material as the channel region 105 in some embodiments. The source/drain regions 105s/105d may also be partly formed of a metal for lower resistance in some embodiments.

A structure including the channel layer 105, gate dielectric layer 110, and gate layer 115 defines an individually gated channel region, also referred to herein as a nanosheet 101, which is repeated to define a plurality of stacked, individually gated channel regions, also referred to herein as a nanosheet stack 102. The nanosheet stack 102 is thus a three-dimensional structure that may be formed on (e.g., as a protruding fin on a surface of) or within (e.g., in a trench defined in) a substrate 107, and may include any number/amount of individually-gated channels 105, for example, based on a desired application. For instance, the number or quantity of channels 105 in the transistor 100 may be determined by a targeted current carrying capacity for the transistor 100. Each of the channel layers 105 may be relatively thin (i.e., less than about 10 nanometers in thickness), allowing for improved electrostatic control. The substrate 107 may, for example, be a silicon substrate, a silicon-on-insulator (SOI) substrate, or other substrate.

The use of crystalline semiconductor materials for the gate dielectric layer 110, the gate layer 115, and the channel region 105 allows for an almost entirely crystalline nanosheet stack 102, with the crystalline gate dielectric layer 110 being directly on the crystalline channel region 105. The interface between the channel region 105 and the gate stack 106 may thus be free of amorphous or non-crystalline layers, thereby reducing SR scattering due to the lack of interface surface roughness. The transistor 100 may thereby exhibit very high channel mobility. The interface between the channel region 105 and the gate stack 106 may also be free of low-k crystalline buffer layers, such as indium phosphide (InP), which may improve short channel performance of the transistor 100 by improving (i.e., reducing) the equivalent oxide thickness (EOT), as only the relatively thin gate dielectric layer 110 (e.g., about 2-3 nm in thickness) may separate the gate layer 115 from the channel region 105.

Also, as shown in the embodiments of FIGS. 1A-1C, each of the channel regions 105 includes a gate stack 106 thereabove and therebelow (that is, on opposing surfaces of the channel region 105), allowing for improved control. For example, the two-dimensional electron gas (2DEG) in each indium arsenide channel region 105 may be gated from above (i.e., on top of the channel 105) and below (i.e., at the bottom of the channel 105). In addition, each of the layers 105, 110, 115 of the nanosheet stack 102 may have respective crystal structures that are substantially lattice matched with the layer therebelow. For example, the layers 105, 110, and/or 115 may be lattice matched heteroepitaxial layers.

The transistor 100 also includes a metal or polycrystalline gate contact layer (also referred to herein as a secondary gate layer or second gate electrode) 615 on an upper surface and opposing sidewalls (that is, on at least three sides) of nanosheet stack 102. The gate contact layer 615 electrically contacts each of the gate layers 115 in the nanosheet stack 102 such that multiple gates 115 may be controlled by a single gate electrode/contact 615, defining a multi-gate, multi-channel device.

Physical properties of a nanosheet stack 102 according to some embodiments of the inventive concepts may include, but are not limited to: a fully crystalline, lattice matched, multi-channel structure including crystalline semiconductor channels 105, gate dielectric layers 110, and gate layers 115; each channel 105 is gated at top and bottom, where the gates 115 are electrically contacted by a common gate contact 615; a ZnTe gate dielectric layer 110 having bandgap of about 3 eV (wide-bandgap semiconductor) with a k of 7.9 (moderate high-k); an AlSb gate layer 115 having a bandgap of about 1.5 eV (moderate bandgap semiconductor) with high dopant activation; and/or multiple channel layers 105, as many as desired for a particular application.

Electrical properties of a nanosheet stack 102 according to some embodiments of the inventive concepts may include, but are not limited to: improved (i.e., thinner) EOT, due to the absence or omission of InP or other buffer layers between the channel region 105 and the gate layer 115; the 2DEG in each InAs channel layer 105 can be controlled from above and below by respective gate layers 115; reduced SR scattering due to the absence/omission of surface roughness/amorphous layers at the interface between the channel layer 105 and the gate dielectric layer 110, (with only small amounts of amorphous insulating layers 420r present at sidewalls of the channel layer 105 for insulation from the gate contact 615); low parasitic resistance and/or low contact resistance due to the highly doped InAs source/drain regions 105s/105d; and high channel mobility, without the use of buffer layers (due to the absence of amorphous layers at the interface between the channel layer 105 and the gate dielectric layer 110). As such, embodiments of the present inventive concept may reduce and/or eliminate the mobility/EOT tradeoff.

Although illustrated with reference to an example structure in FIGS. 1A-1C, it will be understood that embodiments of the present inventive concepts are not so limited. For example, in some embodiments, the nanosheet stack 102 may define a three-dimensional fin-shaped active region protruding from a substrate, with the gate contact layer 615 on an upper surface and sidewalls thereof, in a finFET structure. In other embodiments, the nanosheet stack 102 may be similarly formed within a trench structure in a substrate, with the gate contact 615 extending along at least sidewalls of the trench between the substrate and the nanosheet stack 102. The gate contact 615 may also extend on a top surface of the nanosheet stack in a gate-all-around (GAA) FET structure. More generally, while described herein with reference to particular structures, embodiments of the present inventive concepts may include any structure implementing the substantially crystalline channel/dielectric/gate stack or sub-structures thereof described herein.

Figure 2:
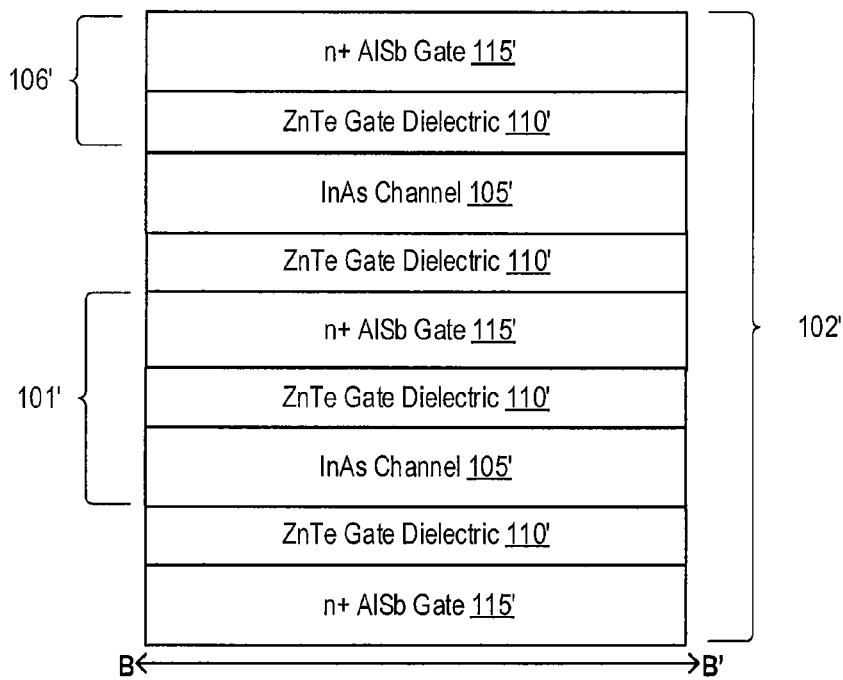
FIGS. 2-6 are cross sectional views taken along line B-B' of FIG. 1A, illustrating methods of fabricating FETs having crystalline channel, dielectric, and gate layers in accordance with some embodiments of the present inventive concepts.

FIGS. 2-12 are cross sectional views illustrating methods of fabricating FET devices in accordance with some embodiments of the present inventive concepts, where FIGS. 2-6 are cross sectional views taken along line B-B' of FIG. 1. Referring now to FIG. 2, in forming a multi-channel III-V FET according to some embodiments of the inventive concepts, a substantially or fully crystalline nanosheet stack 102' is formed. Each nanosheet 101' in the stack 102' includes a gate layer 115' and a gate dielectric layer 110' (which define a gate stack 106'), and a channel layer 105'. One or more of the layers 105', 110', 115' in the stack 102' may be epitaxially grown crystalline semiconductor layers (including, for example, II-VI and/or III-V materials), such that the respective crystallographic orientations of the layers 105', 110', and/or 115' are ordered or registered with the layer therebelow. In the embodiments of FIGS. 2-12, each of the channel layers 105' includes a gate layer 115' on opposite sides thereof and separated therefrom by a respective dielectric layer 110', such that the channel layers 105' are individually-gated from above and below.

Some or all of the layers 105', 110', 115' are formed using semiconductor materials having substantially lattice-matched crystal structures. In the example fabrication methods shown in FIGS. 2-12, the gate layer 115' is formed using heavily doped (n+) AlSb, the dielectric layer 110' is formed using intrinsic ZnTe (or other wide-bandgap II-VI semiconductor), and the channel layer 105' is formed using intrinsic (or lightly doped) InAs. The channel layers 105' may be relatively thin (e.g., from about 2 nm to about 10 nm in thickness) for good electrostatic control, thereby forming multiple quantum wells. Multiple nanosheets 101' may be formed (for example, by alternating heteroepitaxial growth of the layers 105', 110', 115') to define a stack including as many channel regions 105' as may be desired, for example, to meet current and/or layout area constraints.

The use of a substantially or fully crystalline nanosheet stack 102' in accordance with embodiments of the inventive concepts may largely reduce SR scattering, even without the use of buffer layers. In addition, the absence or omission of buffer layers may improve short-channel performance, providing devices suitable for sub-10 nm integration. FET devices according to embodiments of the inventive concepts may thus have high mobility, good short-channel behavior, and excellent parasitic resistance, in addition to the low density of states in the channel(s) and correspondingly low capacitance found in other III-V devices.

Thus, devices according to embodiments of the inventive concepts may excel in or otherwise provide improved CV/I metrics. The low charge sheet density of the inversion layer in the channel regions 105' may also allow the use of a heavily doped polycrystalline gate contact (rather than a metal gate contact) to surround the fully crystalline stack 102' on multiple sides thereof, which may simplify manufacturing processes (as discussed below with reference to FIG. 6), since the associated low charge density in the heavily doped gate contact may result in a very thin depletion layer (and consequently may not significantly degrade electrostatic performance).

Figure 3:
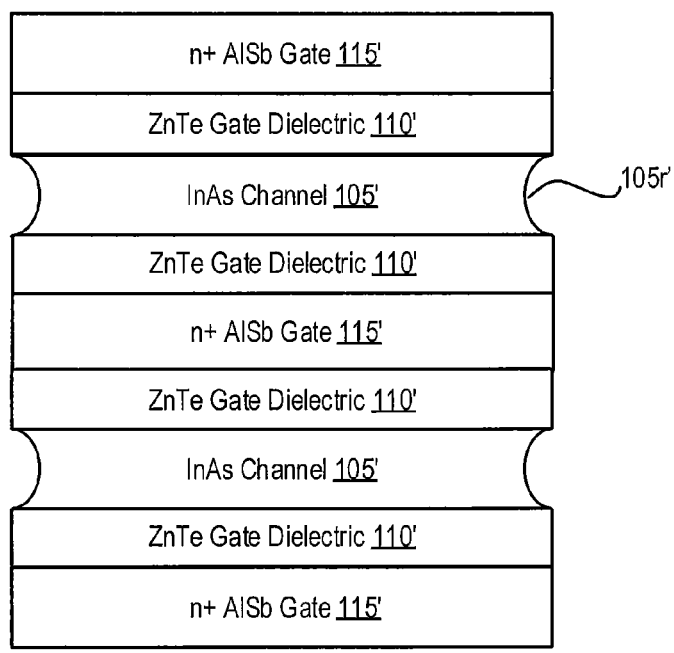

In order to form contacts to the three-dimensional nanosheet stack 102', the channel regions 105' should be insulated from contact with any gates or metal layers. As such, as shown in FIG. 3, a selective isotropic etch of the channel regions 105' is performed. The etchant is selected to remove portions of the channel region 105' at sidewalls of the nanosheet stack 102', without substantially removing or otherwise damaging the gate layers 115' and/or gate dielectric layers 110'. For example, for selectively etching the InAs channel region 105' of FIG. 3, acetic acid and hydrogen peroxide may be used as etchants. However, other etch chemistries may be used to selectively etch the channel layers 105' without substantially etching the gate layers 115' and/or gate dielectric layers 110', depending on the particular materials thereof. As such, sidewalls of the channel regions 105' are selectively recessed relative to the sidewalls of the nanosheet stack 102', defining recessed regions 105r'.

Figure 4:
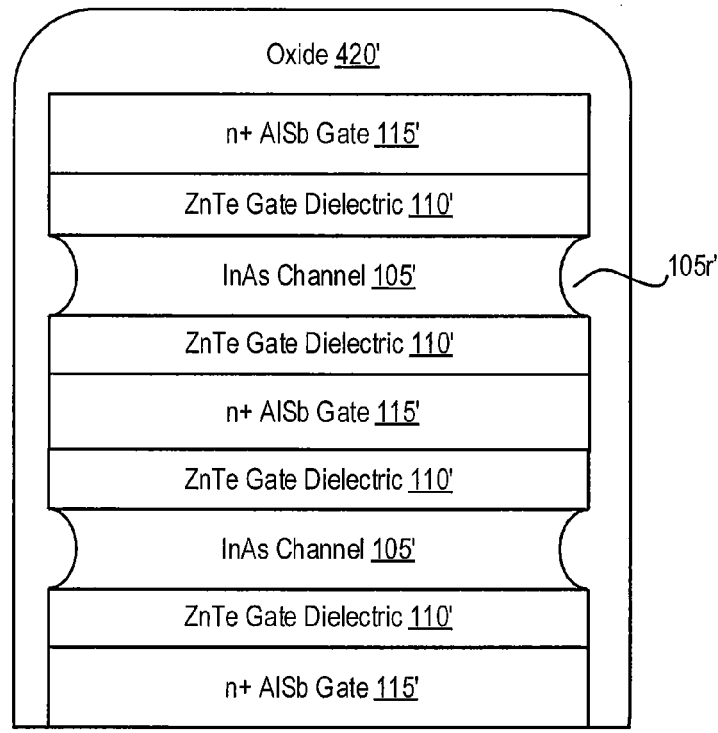

Referring now to FIG. 4, an insulating layer 420' is deposited or otherwise formed on the sidewalls and upper surface of the nanosheet stack. The insulating layer 420' may be an oxide or other amorphous layer, and may be formed on the stack 102' to substantially fill the recessed regions 105r' at the sidewalls of the channel layers 105'.

Figure 5:
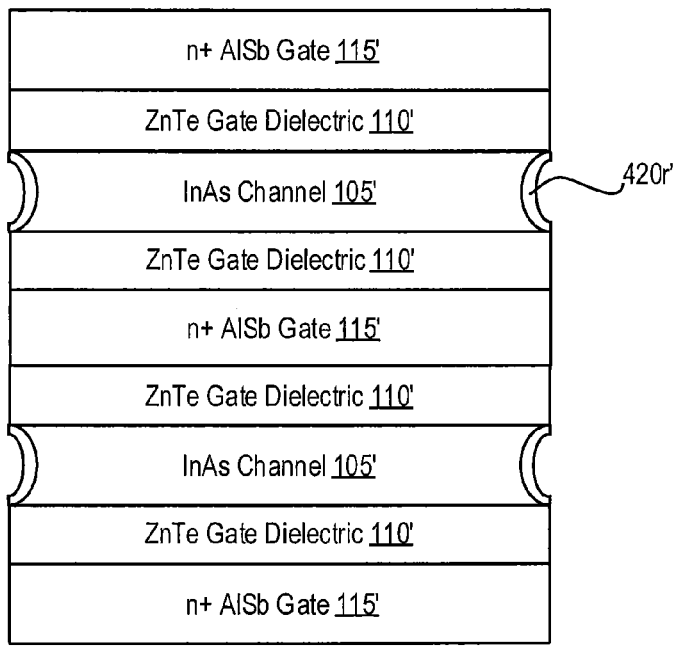

As shown in FIG. 5, an etching process is performed to remove the insulating layer 420' from the upper surface and sidewalls of the nanosheet stack 102'. For example, where an oxide layer is used as the insulating layer 420', a plasma etching process may be used to remove the oxide layer. However, portions of the insulating layer 420' may remain in the recessed regions 105r' at the sidewalls of the channel layers 105'. These remaining portions 420r' of the insulating layer 420' may electrically isolate the channel layers 105' from one or more conductive layers formed in subsequent processes.

Figure 6:
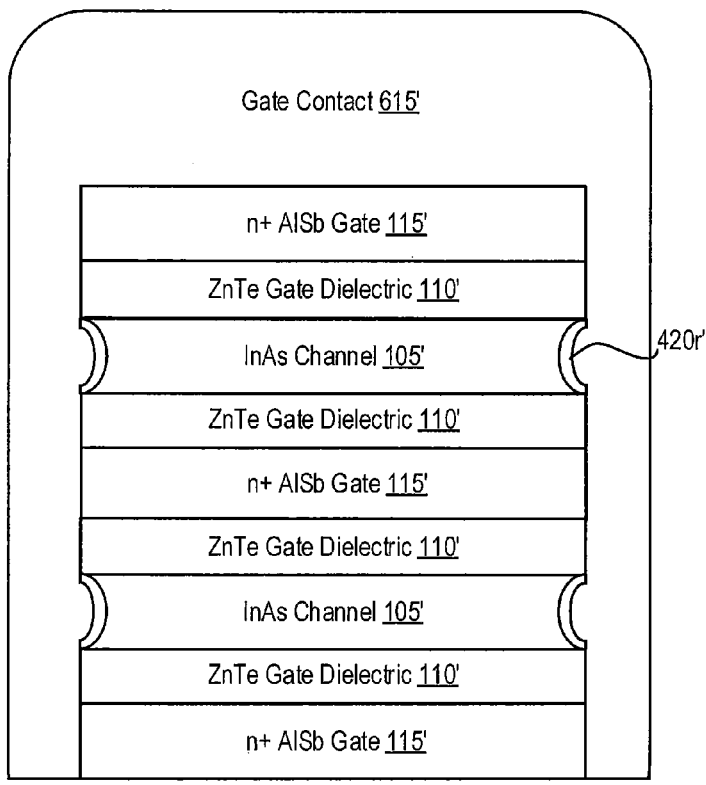

Referring now to FIG. 6, a gate contact layer 615' is selectively formed on portions of the upper surface and sidewalls of the nanosheet stack 102'. The gate contact layer may also be referred to herein as a secondary or top gate 615'. The gate contact layer 615' may thereby "wrap" the entire nanosheet stack 102', providing electrical contact to each of the gate layers 115' of the stack 102', allowing for collective control thereof. However, the channel layers 105' may be electrically isolated from the gate contact 615' by the remaining portions 420r' of the insulating layer 420' at the sidewalls thereof. In particular, as shown in FIG. 6, the gate contact layer 615' may contact the AlSb gate layers 115' at sidewalls thereof, but may be separated and electrically isolated from the InAs channels 105' by the remaining insulating layer portions 420r'.

The gate contact layer 615' may include metal or semiconductor materials. For example, a polycrystalline semiconductor material may be used as the gate contact 615' in some embodiments. The polycrystalline gate contact 615' may be heavily doped, and the relatively low charge density in the heavily doped gate contact 615' may result in a relatively thin depletion layer (and consequently, may not significantly degrade electrostatic performance of the device). The absence of metal in the gate contact layer 615' may also simplify manufacturing processes. However, in other embodiments, a metal material may be used as the gate contact 615' for improved control and/or performance. For example, the polycrystalline gate contact 615' may be replaced by metal at the end of or after processing operations as described herein in some embodiments.

FIGS. 7-12 are cross sectional views further illustrating methods of fabricating FET devices in accordance with some embodiments of the present inventive concepts, taken along line C-C' of FIG. 1A. In embodiments where the gate contact layer 615' of FIG. 6 includes polycrystalline semiconductor material(s), the operations of FIGS. 7-12 may be performed after formation of the gate contact layer 615' in FIG. 6.

Figure 7:
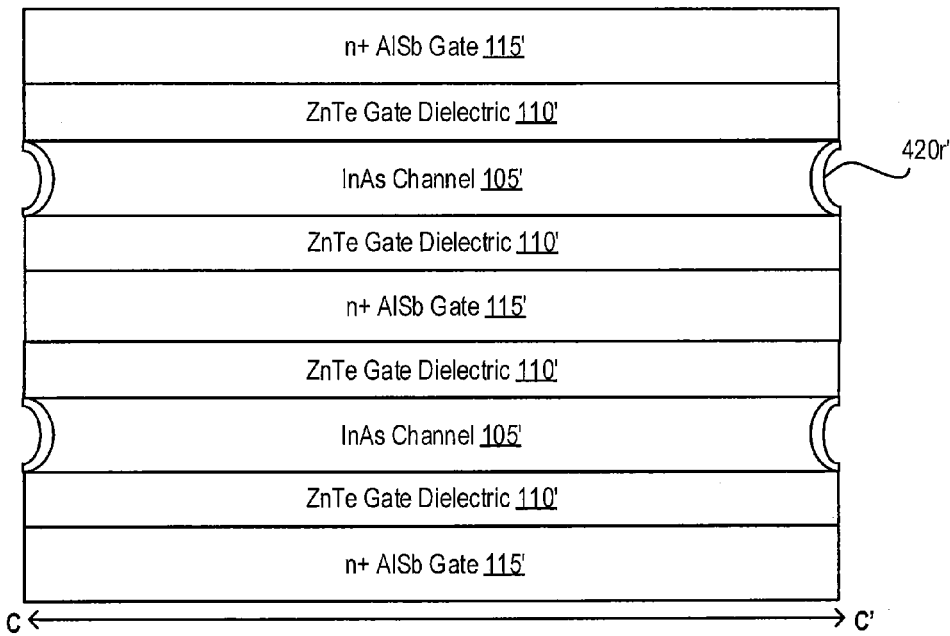
FIGS. 7-12 are cross sectional views taken along line C-C' of FIG. 1A, illustrating methods of fabricating FETs having crystalline channel, dielectric, and gate layers in accordance with some embodiments of the present inventive concepts.
Figure 8:
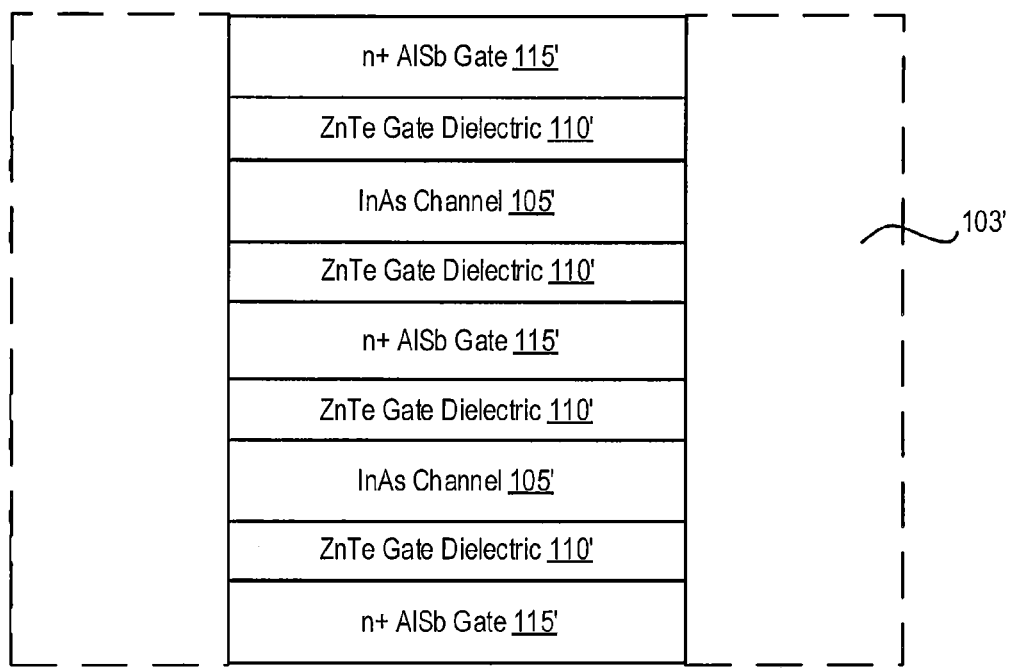

As shown in the cross-section of FIG. 7, sidewalls of the channel layers 105' remain electrically insulated by the remaining insulating layer portions 420r' in the recessed regions 105r' thereof. As such, to allow for contact between the channel layers 105' and the source/drain regions, an etching process is performed to remove portions of the nanosheet stack 102' at which the source/drain regions will be formed in subsequent operations. In particular, as shown in FIG. 8, the nanosheet stack 102' is patterned (for example, using a mask) and etched to remove portions thereof 103' at opposite sides of the channel layers 105'.

Figure 9:
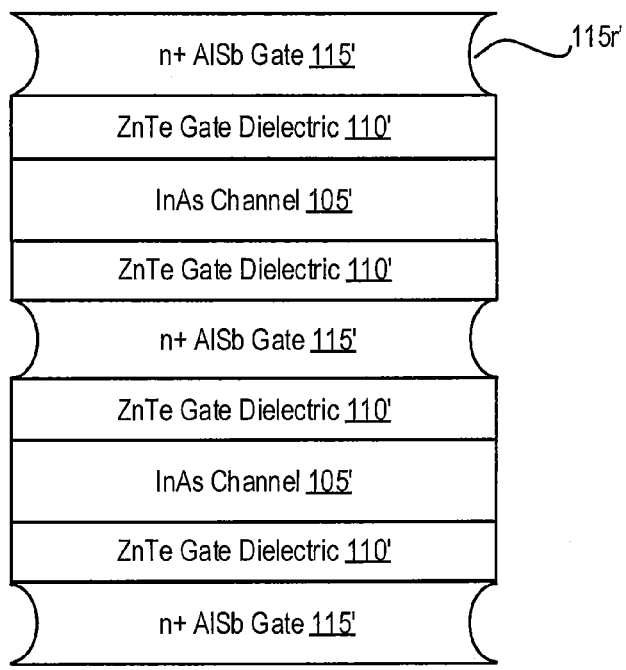

Referring now to FIG. 9, a selective etch of the gate layers 115' is performed. The etchant is selected to selectively remove portions of the gate layers 115' without substantially removing or otherwise damaging the gate dielectric layers 110' and/or the channel layers 105'. For example, for the AlSb gate layers 115' shown in FIG. 9, hydrogen fluoride, hydrogen peroxide and lactic acid, and/or AZ400K may be used as etchants. However, other etch chemistries may be used to selectively etch the gate layers 115' without substantially etching the gate dielectric 110' and or channel layers 105', depending on the particular materials thereof. As such, sidewalls of the gate layers 115' are selectively recessed relative to the sidewalls of the nanosheet stack 102' to define recessed regions 115r'.

Figure 10:
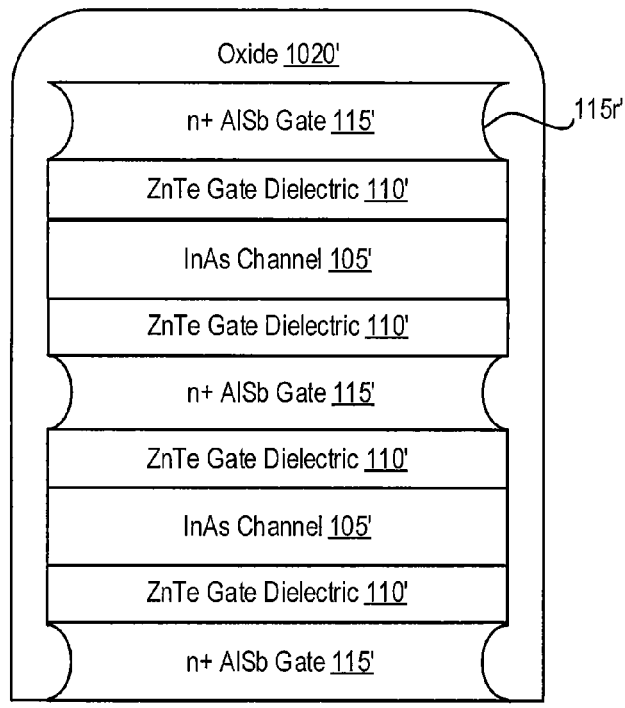

As shown in FIG. 10, an insulating layer 1020' is deposited or otherwise formed on the sidewalls and upper surface of the nanosheet stack 102'. The insulating layer 1020' may be an oxide or other amorphous layer, and may be formed on and/or substantially fill the recessed regions 115r' at the sidewalls of the gate layers 115'.

Figure 11:
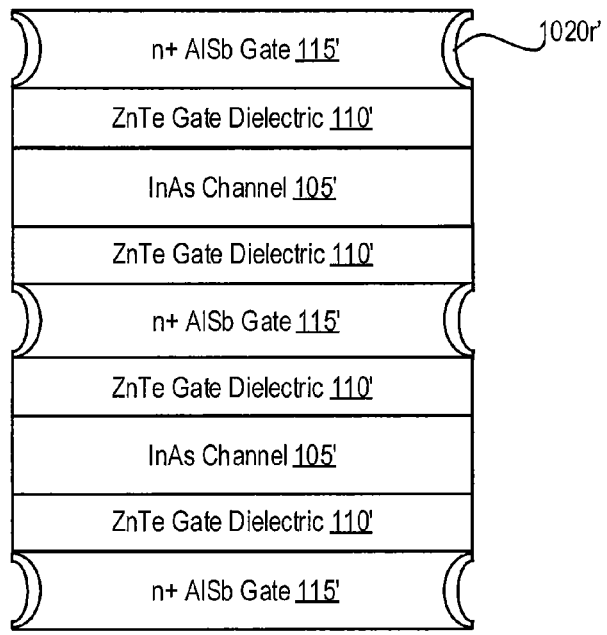

Referring now to FIG. 11, an etching process is performed to remove the insulating layer 1020' from the upper surface and sidewalls of the nanosheet stack 102'. For example, where an oxide layer is used as the insulating layer 1020', a plasma etching process may be used to remove the oxide layer. However, portions 1020r' of the insulating layer 1020' may remain in the recessed regions 115r' at the sidewalls of the gate layers 115'. These remaining portions 1020r' of the insulating layer may electrically isolate the gate layers 115' from the source/drain regions formed in subsequent processes.

Figure 12:
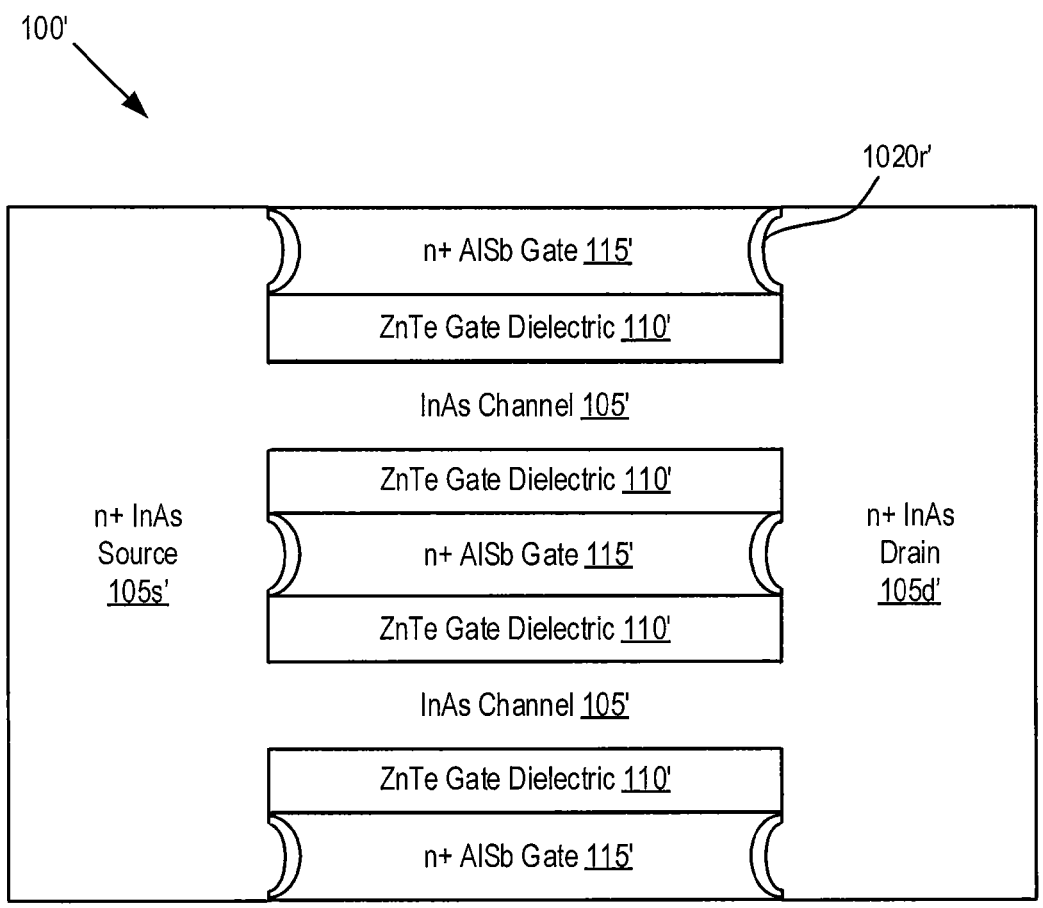

In particular, as shown in FIG. 12, InAs source/drain regions 105s'/105d' are formed at opposite sides of the InAs channel layers 105' in the nanosheet stack 102' to complete the FET 100'. The source/drain regions 105s'/105d' may be formed by an epitaxial regrowth process. In particular, in the example of FIG. 12, in-situ doped n+ InAs regions are epitaxially grown on opposite sides of the channel layers 105' (that is, at the regions 103' of the nanosheet stack that were patterned and etched in FIG. 8). As such, the source/drain regions 105s'/105d' may contact the channel layers 105' at sidewalls thereof. However, the remaining insulating layer portions 1020e in the recessed regions 115r' at the sidewalls of the gate layers 115' electrically isolate the source/drain regions 105s'/105d' from the gate layers 115'. In particular, FIG. 12 illustrates that the InAs source and drain regions 105s' and 105d' may contact the InAs channels 105', but may be separated and electrically isolated from the AlSb gates 115' by the remaining insulating layer portions 1020f.

While embodiments of the present inventive concepts have been described herein with reference to specific materials for the channel layers, gate dielectric layers, and gate layers, it will be understood that other materials may also be used. In particular, the InAs channel layer 105'/ZnTe dielectric layer 110'/AlSb gate layer 115' nanosheet stack 102' described herein may be selected to provide a reduced or minimal lattice mismatch between the layers 105', 110', and 115'. However, in some embodiments, a small amount of mismatch (e.g., on the order of 1%) may be used, resulting in strain in the layers 105', 110', and/or 115', provided that the layers are thin enough (or the strain is small enough) to reduce or prevent relaxation (and the consequent introduction of defects). For example, gallium antimonide (GaSb) can be used for the gate layer 115, with indium antimonide (InSb) for the channel layer 105, which may result in even higher or increased mobility. Also, InAs may be used to create ohmic contacts at the source and drain regions 105s and 105d, which may result in lower or reduced parasitic resistance.

Embodiments of the present inventive concepts may provide several advantages. In particular, devices described herein may offer a high-mobility channel, since SR scattering is largely reduced and/or eliminated by the absence of amorphous layers at the interface between the channel layer 105 and the gate stack 106. Also, short-channel performance may be compatible with sub-10 nm scaling, due to an absence of buffer layers that increase the effective gate oxide thickness.

In addition, the top gate 615 surrounding (or "wrapping") the stack 102 of nanosheets 101 can be metal or polycrystalline semiconductor. A polycrystalline top gate 615 may be used in some embodiments with little electrostatic penalty given the expected low charge sheet densities, and the absence of metal in the top gate 615 may simplify fabrication processes. In other embodiments, however, metal may be used as the top gate 615 to provide improved control and/or performance.

Some embodiments of the inventive concepts may thus provide a high-performance multi-channel III-V FinFET, where each channel is individually gated. No crystalline buffer layers may be used, allowing for high mobility and good (i.e., thinner) EOT. FinFET devices as described herein may also be fabricated using some existing processing operations. Features of specific example embodiments of the present inventive concepts are noted below:

(1) A FET, including a substantially or fully crystalline stack of multiple lattice-matched layers, the multiple lattice-matched layers forming individually-gated conduction channels.

(2) A FET, as in (1), with a subset of the multiple lattice-matched layers forming crystalline conduction channels, a subset of the multiple lattice-matched layers forming crystalline gate dielectrics, and a subset of the multiple lattice-matched layers forming crystalline first gate electrodes, each crystalline conduction channel in the substantially or fully crystalline stack partially or completely surrounded by a crystalline gate dielectric and a crystalline first gate electrode.

(3) A FET, as in (1), in which the lattice-matched layers include III-V or II-VI materials.

(4) A FET, as in (2), with the conduction channels formed of InAs, the gate dielectrics formed of ZnTe, and the first gate electrodes comprised of AlSb.

(5) A FET as in (4), further comprising a finFET, the finFET formed with a second gate electrode wrapping around the substantially or fully crystalline stack of multiple lattice-matched layers, the second gate electrode selectively contacting the first gate electrodes, the second gate electrode and first gate electrodes forming gate-all-around structures, the gate-all-around structures surrounding the individually-gated conduction channels.

(6) A FET as in (5), the second gate electrode including a metal or polycrystalline semiconductor.

(7) A FET as in (6), the finFET formed with a source/drain electrode, the source/drain electrode only selectively contacting the conduction channels.

(8) A FET as in (7), the source/drain electrode including InAs.

(9) A finFET as in (8), including a high mobility conduction channel, the high mobility due to reduction or substantial elimination of surface-roughness scattering in the regions above and below each conduction channel.

(10) A method of forming a finFET as in (8), the method including forming a substantially or fully crystalline stack of multiple lattice-matched layers, forming a second gate electrode wrapping around the crystalline stack of multiple lattice-matched layers, the second gate electrode selectively contacting the first gate electrodes, and forming a source/drain electrode selectively contacting the conduction channels.

Accordingly, field effect transistors in accordance with some embodiments of the inventive concepts can simultaneously achieve the formerly competing goals of high channel mobility (e.g., due to the substantial absence of amorphous or noncrystalline layers on the channel region) and improved short channel performance (e.g., due to the absence of crystalline buffer layers between the channel region and the gate stack, which may increase the effective the gate oxide thickness). Thus, embodiments of the inventive concepts may reduce and/or eliminate the mobility-EOT trade-off.

Further embodiments of the inventive concepts may arise from a realization that crystalline materials on and/or around the channel region to suppress SR scattering may be used in conjunction with strained layers in Group IV MOSFETs to provide high mobility, which may exceed that of some III-V devices. Embodiments of the present inventive concept as described in detail below provide a strained nanosheet structure usable in field effect transistor (FET) applications, such as MOSFETs, and auxiliary components and host devices using such FETs. Such embodiments may also facilitate the retention of strain in the channel layers of the nanosheet stack, as well as the manufacture of nanosheets having widths of 30 nanometers (nm) or more, or more than 40 nm, which may be wider than can be realistically achieved using some conventional etch-and-fill methods. For example, for the, III-V system, sheet width may be limited by high-k and/or metal fill, while for the Si/SiGe system, sheet width may be further limited by etch selectivity between sacrificial materials and channel materials (rather than or in addition to high-k/metal fill).

In particular, some embodiments of the inventive concepts introduce a Group IV channel FET in which the body or channel layer and gate stack are formed substantially or entirely of monocrystalline, lattice mismatched solid-state material layers. In particular embodiments, a multi-channel Si/SiGe MOSFET is implemented as a fully crystalline stack of alternating layers of Si, SiGe, and a crystalline insulator (for example, calcium fluoride ($CaF_2$)). For n-channel MOSFET (also referred to herein as nFET) devices, the channels may be silicon (Si), and the gates may be heavily doped silicon germanium (SiGe). For p-channel MOSFET (also referred to herein as pFET) devices, the channels may be SiGe, and the gates may be heavily doped Si. The stack structure is strained throughout due to lattice mismatch between the respective crystal structures of the channel and gate layer materials, increasing channel mobility for both nFETs and pFETs. Furthermore, the absence of an interface to an amorphous or non-crystalline dielectric layer largely suppresses surface roughness scattering (SR), improving channel mobility. The epitaxial nature of the growth and the absence of the requirement of deep and highly selective lateral (undercut) etches can allow for the fabrication of nanosheet structures having heights and/or widths that are free of the constraints typically found in the standard nanosheet processing. Devices in accordance with embodiments of the inventive concepts may thus provide a significant improvement in both the DC and AC characteristics, relative to some conventional (undercut etched) nanosheets and FinFETs. Some channel thicknesses that may be achieved in accordance with embodiments of the inventive concepts may be in the range of about 4 nm to 6 nm, with a combined dielectric layer and gate layer thickness of about 9 nm to 10 nm. Thicker channels may be possible; however, embodiments of the inventive concepts can enable high performance with thin channels.

Figure 13:
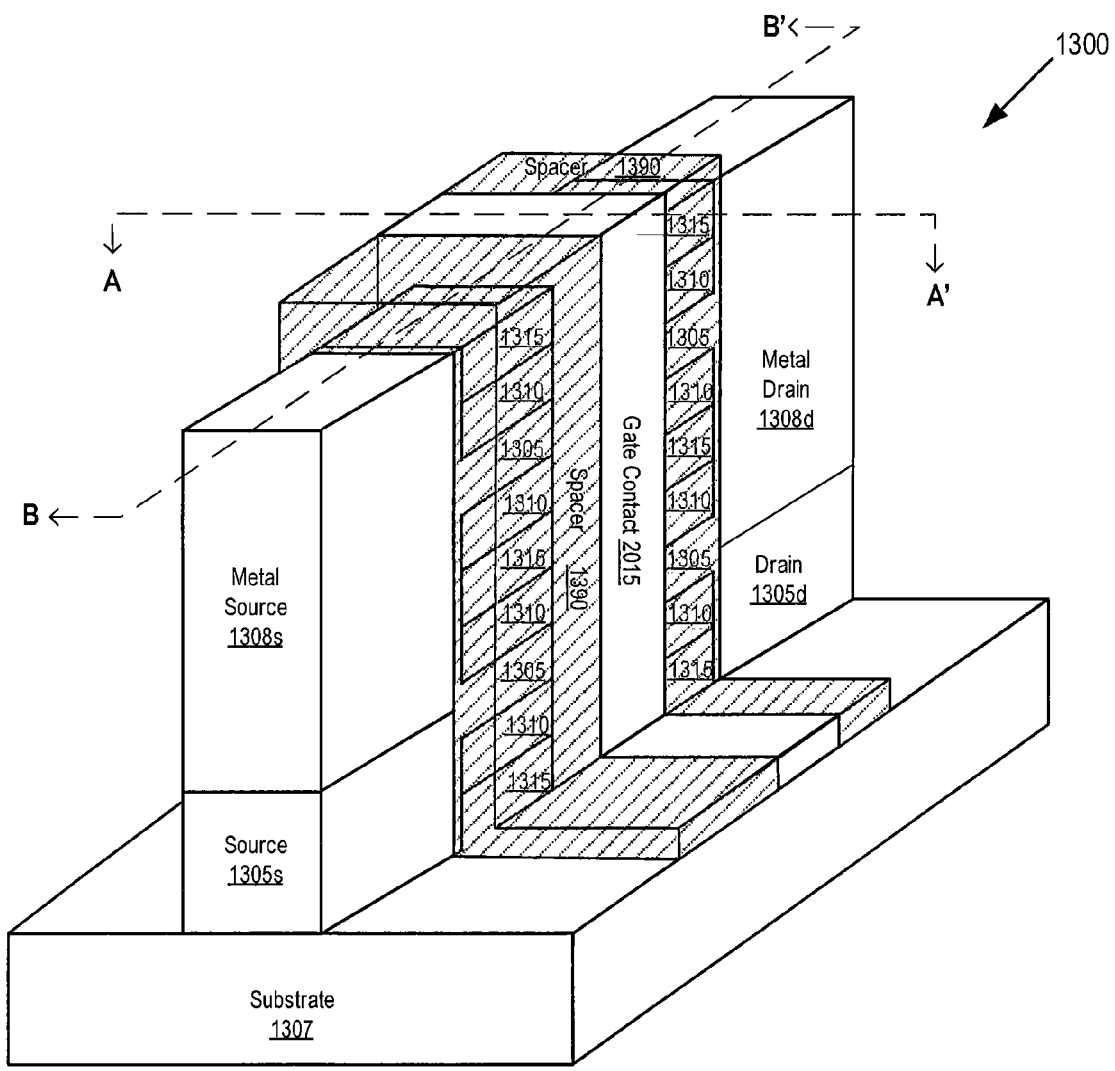
FIG. 13 is a perspective view illustrating FETs having crystalline channel, dielectric, and gate layers in accordance with further embodiments of the present inventive concepts.
Figure 14A:
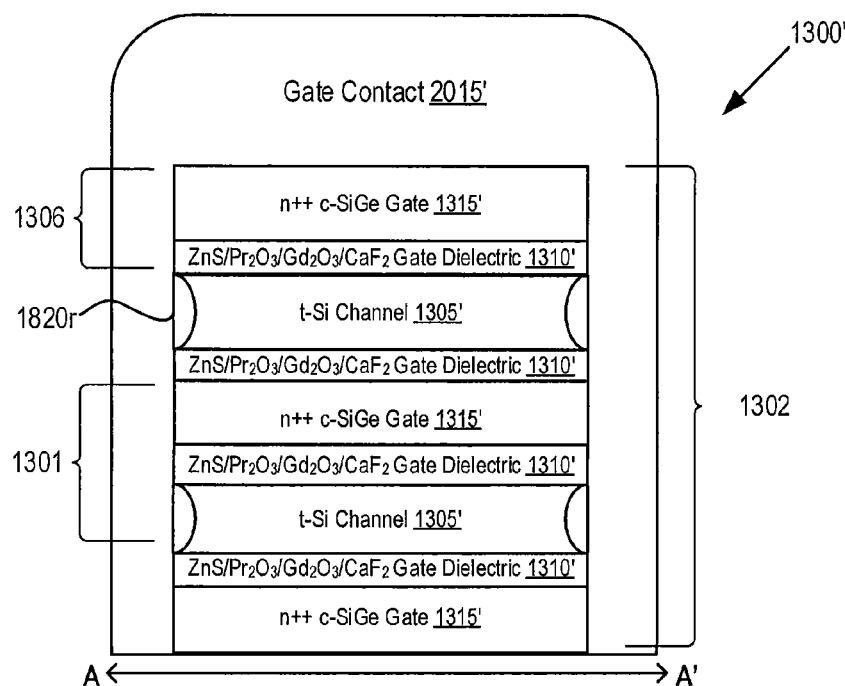
FIGS. 14A and 14B are cross sectional views taken along lines A-A' and B-B' of FIG. 13, respectively, illustrating n-channel FETs in accordance with further embodiments of the present inventive concepts.
Figure 14B:
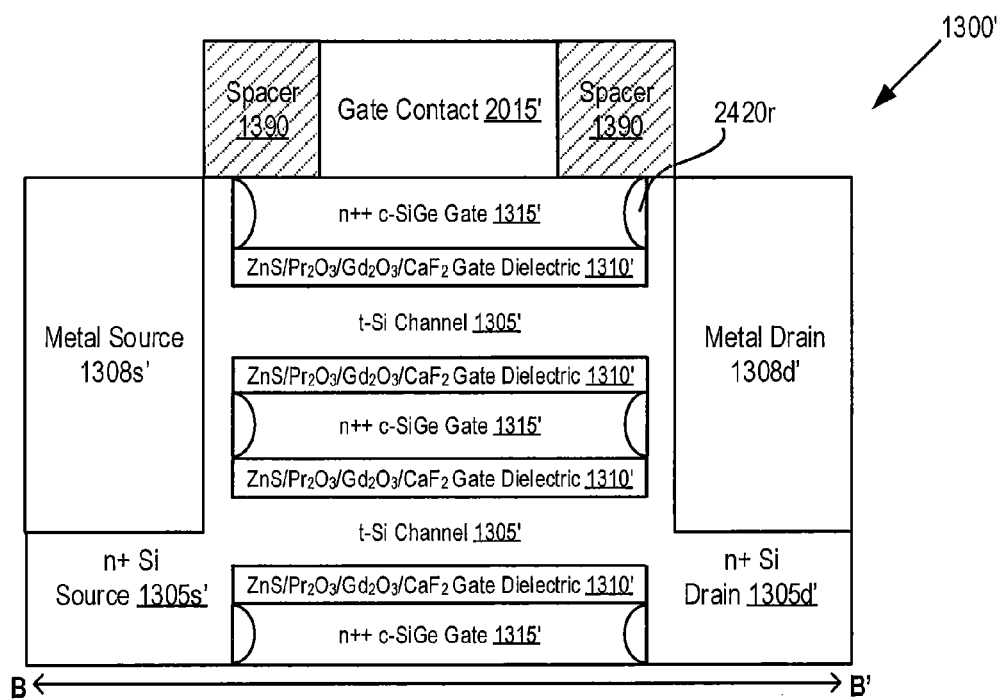

FIG. 13 is a perspective view illustrating FET devices including a crystalline channel, gate, and dielectric layers in accordance with some embodiments of the present inventive concepts. FIGS. 14A and 14B are cross sectional views taken along lines A-A' and B-B' of FIG. 13, respectively, illustrating n-type FETs in accordance with further embodiments of the present inventive concepts, while FIGS. 15A and 15B are cross sectional views taken along lines A-A' and B-B' of FIG. 13, respectively, illustrating p-type FETs in accordance with further embodiments of the present inventive concepts.

As shown in FIGS. 13-15, field effect transistors (FETs) 1300/1300'/1300" in accordance with some embodiments of the present inventive concepts include a structure 1302 having a semiconductor active or body layer defining a transistor channel layer or region 1305, and a semiconductor gate stack 1306 on the channel region 1305. The gate stack 1306 includes a crystalline gate dielectric layer 1310 and a crystalline gate layer 1315 (also referred to herein as a primary gate layer or first gate electrode) thereon. The crystalline gate dielectric layer 1310 may be an undoped, high-k, wide bandgap semiconductor or insulator, while the crystalline gate layer 115 may be a highly doped, moderate bandgap semiconductor.

In particular, for an example nFET as shown in FIGS. 14A-14B, the structure 1302 may include a silicon (Si) channel region 1305', a calcium fluoride (CaF$_2$), zinc sulfide (ZnS), praseodymium oxide (Pr$_2$O$_3$), and/or gadolinium oxide (Gd$_2$O$_3$) gate dielectric layer 1310', and a highly-doped silicon germanium (n++ SiGe) gate layer 1315', all of which may be monocrystalline in some embodiments. The channel region 1305' may be under tensile strain (t-Si), while the gate layer 1315' may be under compressive strain (c-SiGe).

Figure 15A:
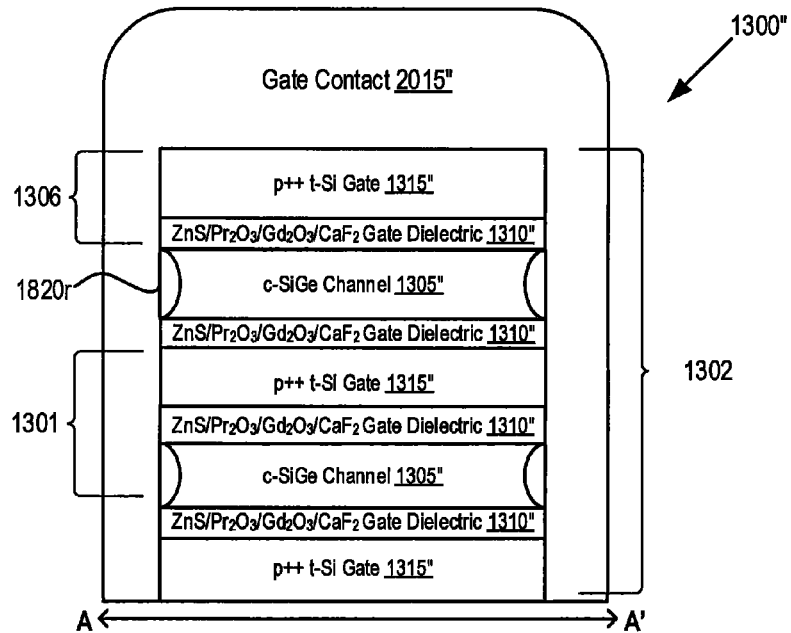
FIGS. 15A and 15B are cross sectional views taken along lines A-A' and B-B' of FIG. 13, respectively, illustrating p-channel FETs in accordance with further embodiments of the present inventive concepts.
Figure 15B:
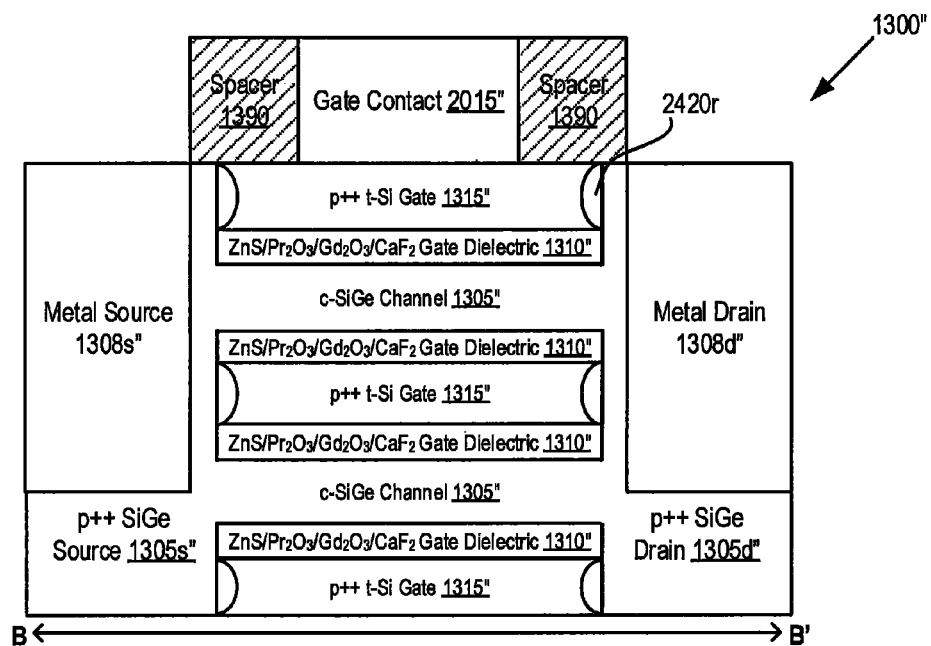

Also, for an example pFET as shown in FIGS. 15A-15B, the structure 1302 may include a silicon germanium (SiGe) channel region 1305", a calcium fluoride (CaF$_2$), zinc sulfide (ZnS), praseodymium oxide (Pr$_2$O$_3$), and/or gadolinium oxide (Gd$_2$O$_3$) gate dielectric layer 1310", and a highly-doped silicon (p++ Si) gate layer 1315", all of which may be monocrystalline in some embodiments. The channel region 1305" may be under compressive strain (c-SiGe), while the gate layer 1315" may be under tensile strain (t-Si).

The channel region 1305 is a crystalline semiconductor layer extending between source and drain regions 1305$s$ and 1305$d$ on opposite sides thereof. The source/drain regions 1305$s$/1305$d$ may be highly doped, providing low contact resistance. The source/drain regions 1305$s$/1305$d$ may also be formed of crystalline semiconductor materials, and may be formed of the same material as the channel region 1305 (n+Si 1305$s'$/1305$d'$ in FIGS. 14A-14B; p++ SiGe 1305$s''$/1305$d''$ in FIGS. 15A-15B) in some embodiments. The source/drain regions 1305$s$/1305$d$ may also be partly formed of metal 1308$s$/1308$d$ for lower resistance in some embodiments.

A structure including the channel layer 1305, gate dielectric layer 1310, and gate layer 1315 defines an individually gated channel region, also referred to herein as a nanosheet 1301, which is repeated to define a plurality of stacked, individually gated channel regions, also referred to herein as a nanosheet stack 1302. The nanosheet stack 1302 is thus a three-dimensional structure that may be formed on (e.g., as a protruding fin on a surface of) or within (e.g., in a trench defined in) a substrate 1307, and may include any number/amount of individually-gated channels 1305, for example, based on a desired application and/or associated stack height, such as to provide a desired current density. Furthermore, the strain in the channels 1305 may be maintained throughout the stack 1302 regardless or independent of the stack height, as the strain source (that is, the lattice mismatch between the channels 1305 and the underlying/overlying gate layers 1315) persists throughout the stack 1302. Each of the channel layers 1305 may be relatively thin (i.e., less than about 10 nanometers in thickness), allowing for improved electrostatic control. The substrate 1307 may, for example, be a silicon substrate, a silicon-on-insulator (SOI) substrate, or other substrate.

The use of crystalline materials for the gate dielectric layer 1310, the gate layer 1315, and the channel region 1305 allows for an almost entirely crystalline nanosheet stack 1302, with the crystalline gate dielectric layer 1310 being directly on the crystalline channel region 1305. The interface between the channel region 1305 and the gate stack 1306 may thus be free of amorphous or non-crystalline layers, thereby reducing SR scattering due to the lack of interface surface roughness. The transistor 1300 may thereby exhibit very high channel mobility.

In some embodiments (for example, embodiments which feature high-Ge content SiGe for the channel), the interface between the channel region 1305 and the gate stack 1306 may also be free of low-k crystalline buffer layers, which may improve short channel performance of the transistor 1300 by improving (i.e., reducing) the equivalent oxide thickness (EOT), as only the relatively thin gate dielectric layer 1310 (e.g., about 2-3 nm in thickness) may separate the gate layer 1315 from the channel region 1305.

In addition, the fully crystalline nanosheet stack 1302 (including crystalline materials for the gate dielectric layer 1310, the gate layer 1315, and the channel region 1305) allows for fabrication of strained channel regions having stack widths and/or heights beyond that which may be achieved by some conventional methods. In particular, as embodiments of the present inventive concepts provide a fully crystalline stack by epitaxial growth, a conventional undercut/lateral etch and refill of one nanosheet material (which may relax strain between layers) can be avoided, allowing for strain to be preserved independent of the stack height, and allowing for stack widths that are not limited by lateral etching constraints. Accordingly, embodiments of the present inventive concepts may allow for stack widths of greater than about 100 nm or more, and/or stack heights of greater than about 100 nm or more, which may not be achieved by some conventional methods. For example, a 6-layer stack of 5 nm nanosheets (with 7 gate layers around them, 10 nm thick each) may provide a stack height of about 100 nm, which may not be achieved using some conventional etch-and-fill methods.

Also, as shown in the embodiments of FIGS. 13-15, each of the channel regions 1305/1305'/1305" includes a gate stack 1306 thereabove and therebelow (that is, on opposing surfaces of the channel region), allowing for improved control. For example, the two-dimensional electron gas (2DEG) in each Si channel region 1305' or SiGe channel region 1305" may be gated from above (i.e., on top of the channel 1305'/1305") and below (i.e., at the bottom of the channel 1305'/1305"). In addition, each of the layers 1305, 1310, 1315 of the nanosheet stack 1302 may have respective crystal structures that are lattice mismatched with the layer therebelow. For example, the layers 1305, 1310, and/or 1315 may be lattice mismatched heteroepitaxial layers.

The transistors 1300/1300'/1300" also include a metal or polycrystalline gate contact layer (also referred to herein as a secondary gate layer or second gate electrode) 2015/2015'/2015" on an upper surface and opposing sidewalls (that is, on at least three sides) of nanosheet stack 1302. For example, the gate contact layer 2015' may be SiGe for the nFET 1300', while the gate contact layer 2015" may be Si for the pFET 1300". The gate contact layer 2015 electrically contacts each of the gate layers 1315 in the nanosheet stack 1302 such that multiple gates 1315 may be controlled by a single gate electrode/contact 2015, defining a multi-gate, multi-channel device. Wraparound spacers 1390 may also be provided on opposite sides of the gate contact layer 2015/2015'/2015".

Physical properties of a nanosheet stack 1302 according to some embodiments of the inventive concepts may include, but are not limited to: a fully crystalline, lattice mismatched, multi-channel structure including crystalline semiconductor channels 1305, gate dielectric layers 1310, and gate layers 1315; each channel 1305 is gated at top and bottom, where the gates 1315 are electrically contacted by a common gate contact 2015; a $CaF_2$, ZnS, $Pr_2O_3$, and/or $Gd_2O_3$ gate dielectric layer 1310 having a wide bandgap with moderately high-k; Si/SiGe layers epitaxially grown on the gate dielectric layer 1310; multiple channel layers 1305, as many as desired for a particular application; isolation between channel 1305 and gate layers 1315 by a dielectric layer (such as $SiO_2$); isolation between the gate layers 1315 and the source/drain regions 1305s/1305d by a dielectric layer (such as $SiO_2$); highly-doped gate mono crystalline layers 1315; lightly-doped (or intrinsic) channels 1305; and a stoichiometry for the SiGe layers that is selected to induce sufficient strain in the Si layers.

Electrical properties of a nanosheet stack 1302 according to some embodiments of the inventive concepts may include, but are not limited to: the 2DEG in each Si or SiGe channel layer 1305' or 1305" can be controlled from above and below by respective gate layers 1315' or 1315"; reduced SR scattering due to the absence/omission of surface roughness/amorphous layers at the interface between the channel layer 1305 and the gate dielectric layer 1310, (with only small amounts of amorphous insulating layers 1920r present at sidewalls of the channel layer 1305 for insulation from the gate contact 2015); high tensile strain in Si channels (or high compressive strain in SiGe channels), with reduced or minimal relaxation due to maintaining the strain sources along and throughout the stack height; high channel mobility, without the use of buffer layers (due to the absence of amorphous layers at the interface between the channel layer 1305 and the gate dielectric layer 1310); moderate inversion charge/low capacitance due to gate depletion; and low parasitic resistance (Rpara) due to the large contact area.

In some embodiments, the magnitude of strain in the channel layers can depend on the relative thickness of the channel and dielectric and gate layers, as well as the lattice constant difference of the channel and gate stack (rather than absolute thickness). For some materials described herein, a thickness ratio of 1 may results in about 1.5 GPa of stress in the channel. For ratios of about 2 in some of the embodiments described herein, stresses in the range 2.5-3 GPa may be possible; the layers may therefore be kept thin (for example, a critical thickness of less than 20 nm) to reduce or prevent relaxation Although illustrated with reference to an example structure in FIGS. 13-15, it will be understood that embodiments of the present inventive concepts are not so limited. For example, in some embodiments, the nanosheet stack 1302 may define a three-dimensional fin-shaped active region protruding from a substrate, with the gate contact layer 2015 on an upper surface and sidewalls thereof, in a finFET structure. In other embodiments, the nanosheet stack 1302 may be similarly formed within a trench structure in a substrate, with the gate contact 2015 extending along at least sidewalls of the trench between the substrate and the nanosheet stack 1302. The gate contact 2015 may also extend on a top surface of the nanosheet stack in a gate-all-around (GAA) FET structure. More generally, while described herein with reference to particular structures, embodiments of the present inventive concepts may include any structure implementing the substantially crystalline strained channel/dielectric/gate stack or sub-structures thereof described herein.

FIGS. 16-20 are cross sectional views illustrating methods of fabricating nFET devices as shown in FIGS. 14A-14B in accordance with some embodiments of the present inventive concepts, where FIGS. 16-20 are taken along line A-A' of FIG. 13. However, it will be understood that the methods of FIGS. 16-20 may be similarly applied to fabricate pFET devices as shown in FIGS. 15A-15B by using the materials shown therein. That is, while illustrated with reference to nFET fabrication, it will be understood that the illustrated fabrication steps may be similarly applied to pFET fabrication by substitution of the corresponding material layers.

Figure 16:
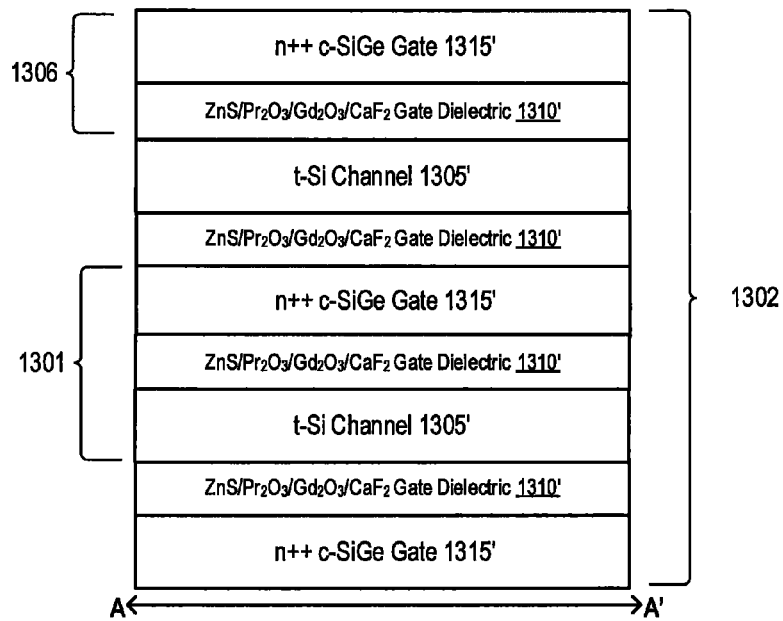
FIGS. 16-20 are cross sectional views taken along line A-A' of FIG. 13, illustrating methods of fabricating n-type FETs having crystalline channel, dielectric, and gate layers in accordance with further embodiments of the present inventive concepts.

Referring now to FIG. 16, in forming a multi-channel Si/SiGe MOSFET according to some embodiments of the inventive concepts, a substantially or fully crystalline nanosheet stack 102' is formed. Each nanosheet 1301 in the stack 1302 includes a crystalline gate layer 1315' and a crystalline gate dielectric layer 1310' (which define a gate stack 1306), and a crystalline channel layer 1305. All of the layers 1305', 1310', 1315' are formed using crystalline semiconductors or insulators. One or more of the layers 1305', 1310', 1315' in the stack 102' may be epitaxially grown, such that the respective crystallographic orientations of the layers 1305', 1310', and/or 1315' are ordered or registered with the layer therebelow. In the embodiments of FIGS. 16-26, each of the channel layers 1305' includes a gate layer 1315' on opposite sides thereof and separated therefrom by a respective dielectric layer 1310', such that the channel layers 1305' are individually-gated from above and below.

Some or all of the layers 1305', 1310', 1315' are formed using semiconductor materials having lattice-mismatched crystal structures. In the embodiments of FIGS. 16-26, the gate layer 1315' is formed using heavily doped (n++) SiGe, the crystalline dielectric 1310' is formed using one of $CaF_2$, ZnS, $Pr_2O_3$, or $Gd_2O_3$, and the channel 1305' is formed using intrinsic (or lightly doped) Si. Alternatively, for a pFET, the gate layer 1315' may be formed using heavily doped Si, the crystalline dielectric 1310' may be formed using one of $CaF_2$, ZnS, $Pr_2O_3$, or $Gd_2O_3$, and the channel 1305' may be formed using intrinsic (or lightly doped) SiGe. The channel layers 1305' are thin (on the order of a few nm in one embodiment) for good electrostatic control, thereby forming quantum wells. Multiple nanosheets 1301 may be used to obtain a desired current/layout area.

The use of a substantially or fully crystalline nanosheet stack 1302 in accordance with embodiments of the inventive concepts may largely reduce or eliminate surface roughness (SR) scattering, due to the absence of amorphous/non-crystalline layers at the interface between the channel region 1305 and the gate stack 1306. Furthermore, the lattice mismatch between the Si and SiGe layers induces strain in the entire stack. The SiGe layers are compressively strained, while the Si layers have tensile strain. As the stack is fully-crystalline stack, strain can be preserved even in taller stacks (i.e., independent of stack height), since the strain source (lattice mismatch) persists along and throughout the height of the stack. This is in contrast to a bottom-strained finFET (on stress-relaxed buffer (SRB) or silicon (or other) on insulator (xOI) in which the strain may relax towards the top of the fin. Indeed, some standard nanosheets (formed by an undercut etch of one nanosheet material relative to the other nanosheet material, followed by appropriate material refill of the undercut regions) may be unstrained, since each channel sheet may have two free surfaces during processing which relaxes the stress. Accordingly, the combination of SR suppression and strain in the channel layers in accordance with embodiments of the present inventive concepts can result in very high mobility, exceeding that of unbuffered III-V InGaAs devices.

The use of heavily doped semiconductors for the gate material in place of metal gates may result in a loss of inversion density ("poly" depletion). However, the very high channel mobility more than makes up for the loss in charge density, for overall higher current density. Thus, devices according to embodiments of the inventive concepts may provide improved current density and reduced capacitance, excelling in the CV/I metric. The number of nanosheets can be tailored to the circuit application, with a larger number of sheets used to drive BEOL (back end of line) loaded portions of the circuit, and a smaller number of sheets for gate-loaded, small-fanout applications.

Figure 17:
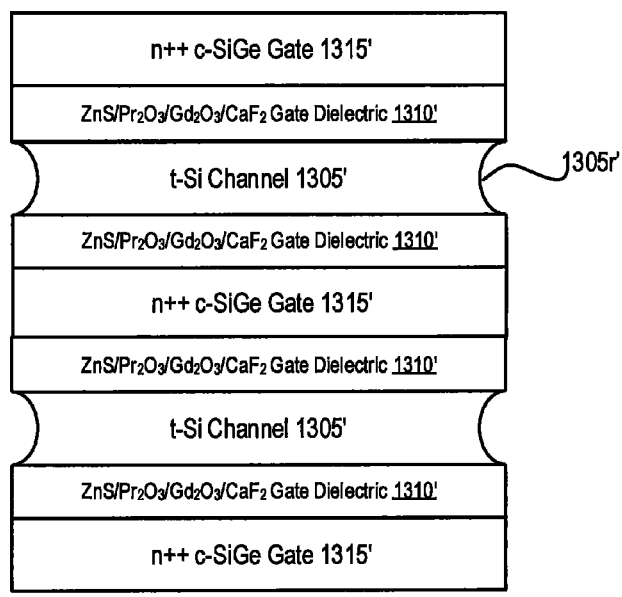

Methods of manufacturing devices as described herein can address some challenges with respect to formation of contacts to the 3-D nanosheet stack, as the source and drain regions **1305*s'*/1305*d'* should electrically contact the channels 1305' but not the gate layers 1315' (as shown in FIG. 14B), while the wraparound or secondary gate 2015 should electrically contact the gate layers 1315' but not the channels 1305' (as shown in FIG. 14A). In particular, as shown in FIG. 17, in order to form contacts to the three-dimensional nanosheet stack 1302 such that the channel regions 1305' are insulated from contact with any gates or metal layers, a selective isotropic etch of the channel regions 1305' is performed. The etchant is selected to remove portions of the channel region 1305' at sidewalls of the nanosheet stack 1302, without substantially removing or otherwise damaging the gate layers 1315' and/or gate dielectric layers 1310', depending on the particular materials thereof. For example, some conventional etch chemistries for selective etching of Si/SiGe may be used, and exceedingly high selectivity may not be required to provide such a shallow etch. As such, sidewalls of the channel regions 1305' are selectively recessed relative to the sidewalls of the nanosheet stack 1302, defining recessed regions 1305*r'***.

Figure 18:
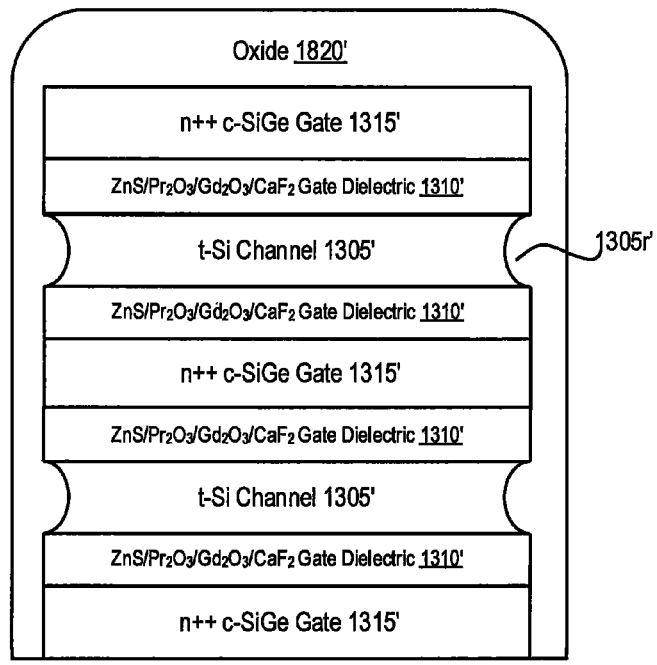

Referring now to FIG. 18, an insulating layer 1820 is deposited or otherwise formed on the sidewalls and upper surface of the nanosheet stack. The insulating layer 1820 may be an oxide or other amorphous layer, and may be formed on the stack 1302 to substantially fill the recessed regions **1305*r'* at the sidewalls of the channel layers 1305'. For example, in some embodiments, the insulating layer 1820** may be a low-k dielectric layer, such as silicon dioxide ($SiO_2$).

Figure 19:
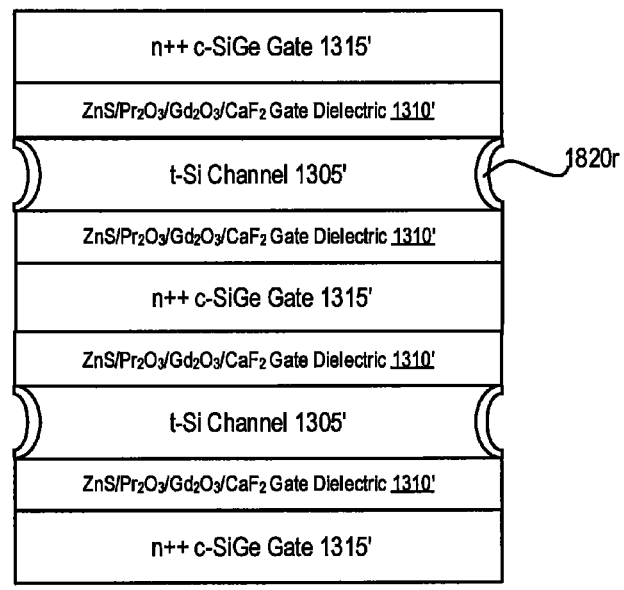

As shown in FIG. 19, an etching process is performed to remove the insulating layer 1820 from the upper surface and sidewalls of the nanosheet stack 1302. For example, where an oxide layer is used as the insulating layer 1820, a plasma etching process may be used to remove the oxide layer. However, portions of the insulating layer 1820 may remain in the recessed regions **1305*r'* at the sidewalls of the channel layers 1305'. These remaining portions 1820*r* of the insulating layer 1820 may electrically isolate the channel layers 1305'** from one or more conductive layers formed in subsequent processes.

Figure 20:
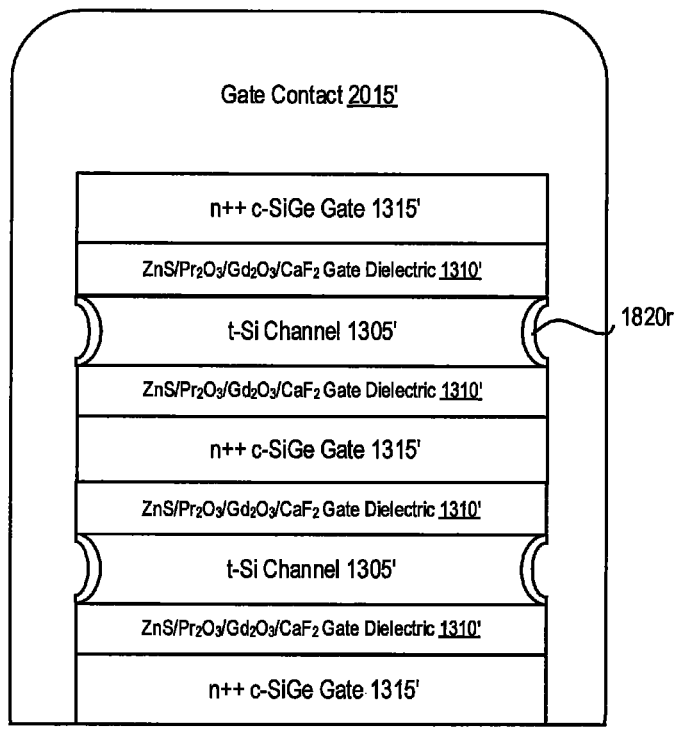

Referring now to FIG. 20, a gate contact layer 2015' is selectively formed on portions of the upper surface and sidewalls of the nanosheet stack 1302. The gate contact layer may also be referred to herein as a secondary or top gate 2015'. The gate contact layer 2015' may thereby "wrap" the entire nanosheet stack 1302, providing electrical contact to each of the gate layers 1315' of the stack 1302, allowing for collective control thereof. However, the channel layers 1305' may be electrically isolated from the gate contact 1315' by the remaining portions **1820*r* of the insulating layer 1820 at the sidewalls thereof. In particular, as shown in FIG. 20, the gate contact layer 2015' may contact the SiGe gate layers 1315' at sidewalls thereof, but may be separated and electrically isolated from the Si channels 1305' by the remaining insulating layer portions 1820*r***.

The gate contact layer 2015' may include metal or semiconductor materials. A polycrystalline semiconductor material may be used as the gate contact 2015' in some embodiments. The polycrystalline gate contact 2015' may be heavily doped, and the relatively low charge density in the heavily doped gate contact 2015' may result in a relatively thin depletion layer (and consequently, may not significantly degrade electrostatic performance of the device). For example, the gate contact layer 2015' may be SiGe for an nFET, while the gate contact layer 2015" may be Si for a pFET. The absence of metal in the gate contact layer 2015' may also simplify manufacturing processes. However, in other embodiments, a metal material may be used as the gate contact 2015' for improved control and/or performance. For example, the polycrystalline gate contact 2015' may be replaced by metal at the end of or after processing operations as described herein in some embodiments.

FIGS. 21-26 are cross sectional views further illustrating methods of fabricating nFET devices in accordance with some embodiments of the present inventive concepts, taken along line B-B' of FIG. 13. In embodiments where the gate contact layer 2015' of FIG. 20 includes polycrystalline semiconductor material(s), the operations of FIGS. 21-26 may be performed after formation of the gate contact layer 2015' in FIG. 20.

Figure 21:
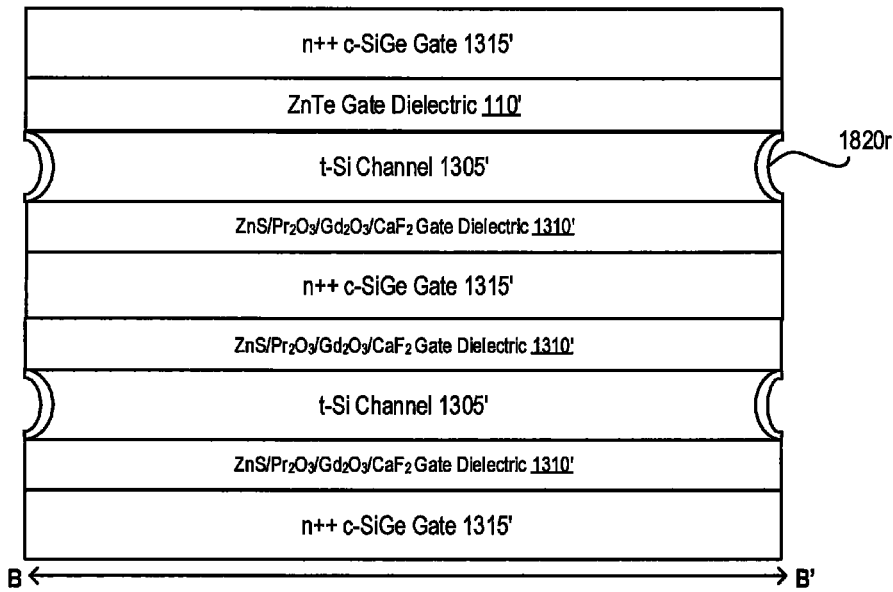
FIGS. 21-26 are cross sectional views taken along line B-B' of FIG. 13, illustrating methods of fabricating n-type FETs having crystalline channel, dielectric, and gate layers in accordance with some embodiments of the present inventive concepts.
Figure 22:
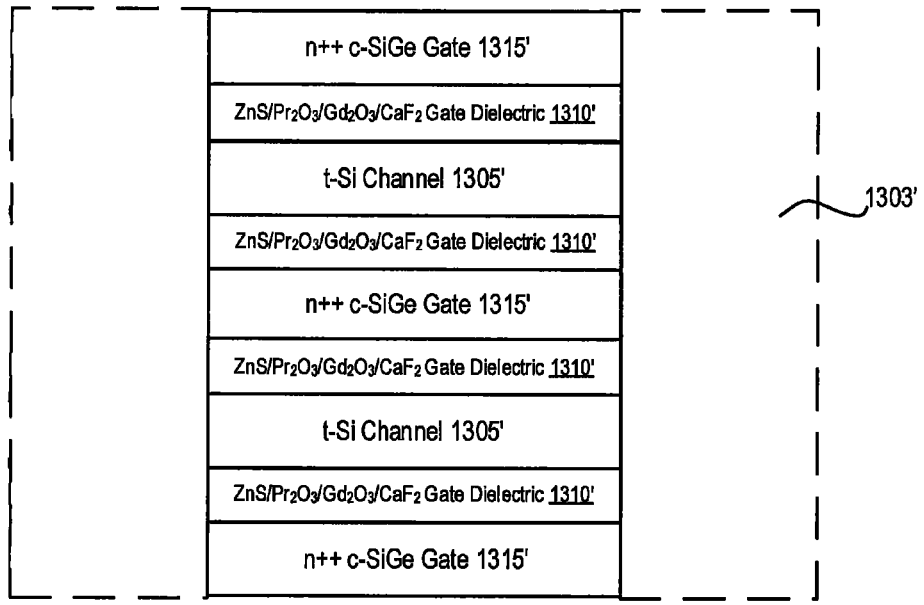

As shown in the cross-section of FIG. 21, sidewalls of the channel layers 1305' remain electrically insulated by the remaining insulating layer portions 1820r in the recessed regions 1305r' thereof. As such, to allow for contact between the channel layers 1305' and the source/drain regions, an etching process is performed to remove portions of the nanosheet stack 1302 at which the source/drain regions will be formed in subsequent operations. In particular, as shown in FIG. 22, the nanosheet stack 1302 is patterned (for example, using a mask) and etched to remove portions thereof 1303' at opposite sides of the channel layers 1305'.

Figure 23:
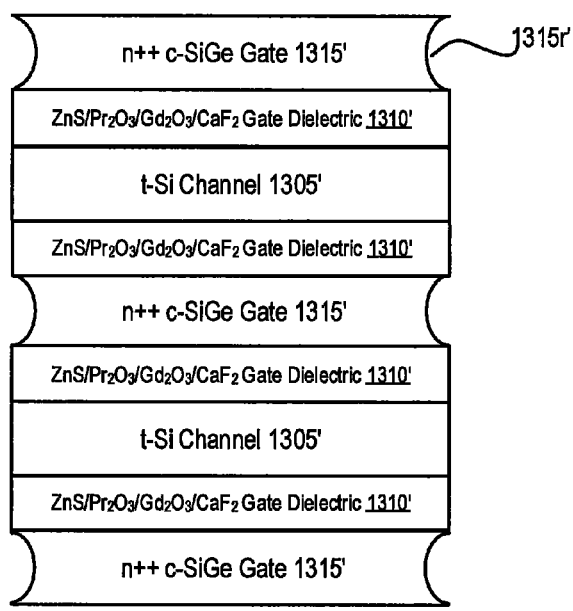

Referring now to FIG. 23, a selective isotropic etch of the gate layers 1315' is performed. The etchant is selected to selectively remove portions of the gate layers 1315' without substantially removing or otherwise damaging the gate dielectric layers 1310' and/or the channel layers 1305', depending on the particular materials thereof. As such, sidewalls of the gate layers 1315' are selectively recessed relative to the sidewalls of the nanosheet stack 1302 to define recessed regions 1315r'.

Figure 24:
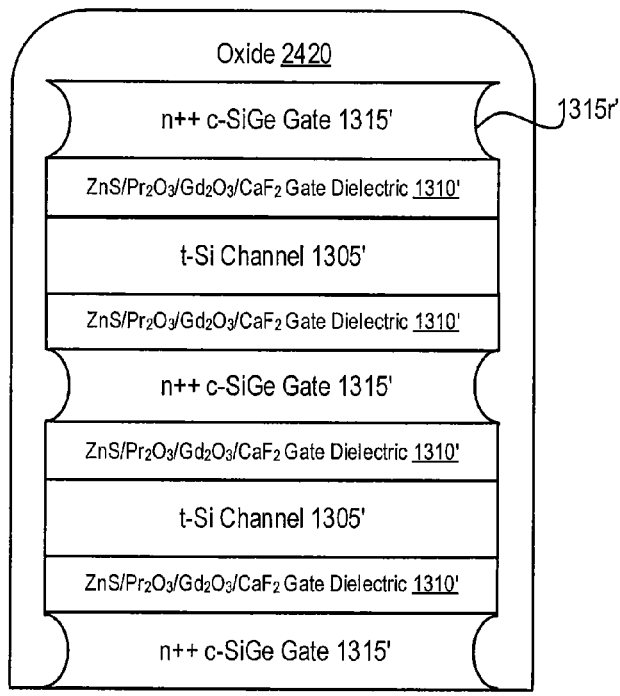

As shown in FIG. 24, an insulating layer 2420 is deposited or otherwise formed on the sidewalls and upper surface of the nanosheet stack 1302. The insulating layer 2420 may be an oxide or other amorphous layer, and may be formed on and/or substantially fill the recessed regions 1315r' at the sidewalls of the gate layers 1315'. For example, in some embodiments, the insulating layer 2420 may be a low-k dielectric layer, such as silicon dioxide ($SiO_2$).

Figure 25:
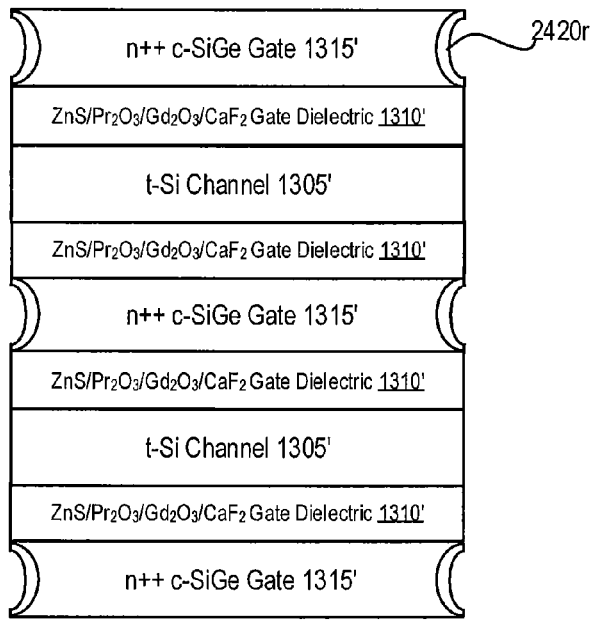

Referring now to FIG. 25, an etching process is performed to remove the insulating layer 2420 from the upper surface and sidewalls of the nanosheet stack 1302. For example, where an oxide layer is used as the insulating layer 2420, a plasma etching process may be used to remove the oxide layer. However, portions 2420r of the insulating layer 2420 may remain in the recessed regions 1315r' at the sidewalls of the gate layers 1315'. These remaining portions 2420r of the insulating layer may electrically isolate the gate layers 1315' from the source/drain regions formed in subsequent processes.

Figure 26:
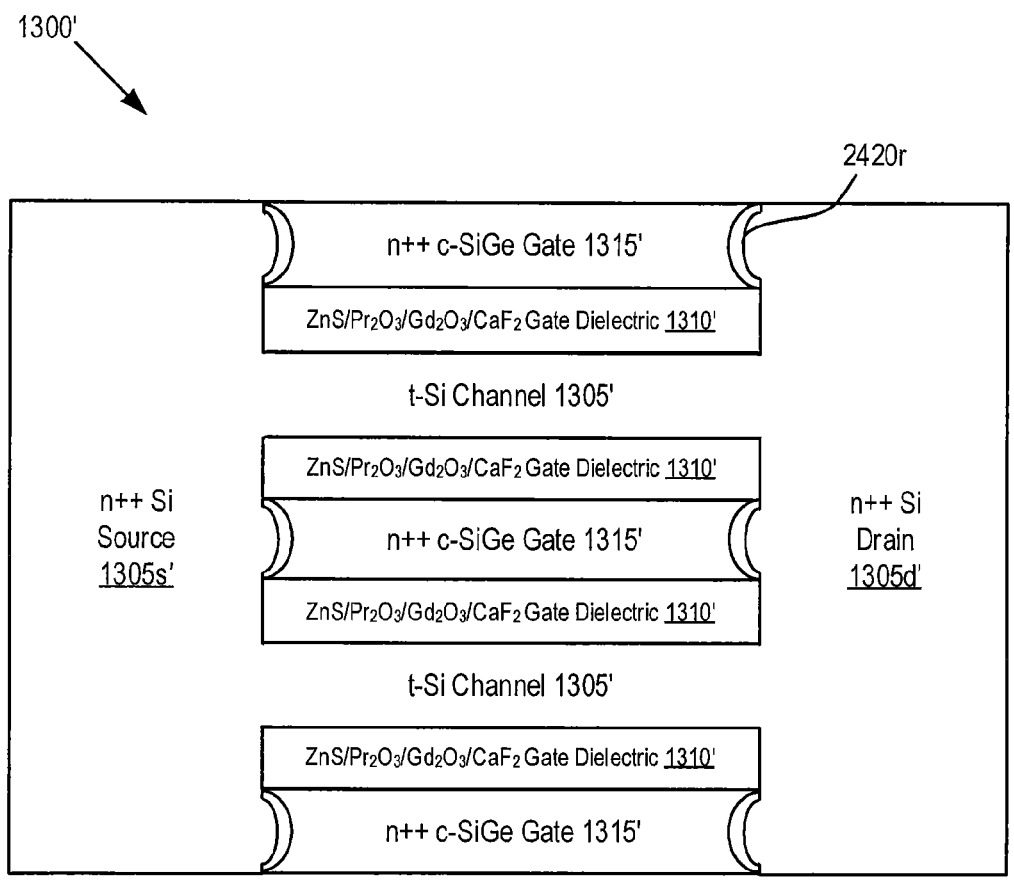

In particular, as shown in FIG. 26, n++ Si source/drain regions 1305s'/1305d' are formed at opposite sides of the Si channel layers 1305' in the nanosheet stack 1302' to complete the nFET 1300'. The source/drain regions 1305s'/1305d' may be formed by an epitaxial regrowth process. For example, in the nFET device 1300' of FIG. 26, in-situ doped n+Si regions 1305s'/1305d' are epitaxially grown on opposite sides of the Si channel layers 1305' (that is, at the regions 1303' of the nanosheet stack that were patterned and etched in FIG. 21). Likewise, in a pFET device 1300" as shown in FIG. 15B, in-situ doped p++SiGe regions 1305s"/1305d" may be epitaxially grown on opposite sides of the SiGe channel layers 1305". As such, the source/drain regions 1305s'/1305d' may contact the channel layers 1305' at sidewalls thereof. However, the remaining insulating layer portions 2420r in the recessed regions 1315r' at the sidewalls of the gate layers 1315' electrically isolate the source/drain regions 1305s'/1305d' from the gate layers 1315'. In particular, FIG. 26 illustrates that the Si source and drain regions 1305s' and 1305d' may contact the Si channels 1305', but may be separated and electrically isolated from the SiGe gates 1315' by the remaining insulating layer portions 2420r.

The placement of the strain sources (material interfaces) between the gate layers 1315' and the channel regions 1305' across or throughout the entire height of the stack 1302 can reduce or prevent strain loss due to the source/drain recessing shown in FIG. 22. Therefore, a relatively deep source/drain recess may be performed, and a majority of or an entire vertical sidewall of the remaining source/drain epitaxial layers may be silicided to define the metal source/drain regions 1307s/1307d shown in FIGS. 13, 14B, and 15B. This can provide a relatively large contact area, reducing the overall parasitic resistance.

While embodiments of the present inventive concepts have been described herein with reference to specific materials for the channel layers, gate dielectric layers, and gate layers in the context of n-type finFETs, it will be understood that other materials may also be used. In particular, as noted above, a p-type finFET 1300" (as shown for example in FIGS. 15A-15B) may be formed by substantially similar fabrication techniques as illustrated in FIGS. 16-26, except where the channel layer or region 1305" is formed of SiGe, the gate layer 1315" is formed of Si, and the source/drain regions 1305s"/1305d" are formed of SiGe.

In both n-type 1300' and p-type 1300" devices described herein, lattice mismatch between the channel layers 1305'/1305" and the gate layers 1315'/1315" is used to create strain (compressive strain in the SiGe layers; tensile strain in the Si layers).

Embodiments of the present inventive concepts may provide several advantages. For instance, devices described herein may provide high-mobility channels, since SR scattering can be largely reduced and/or eliminated (by the absence of amorphous layers at the interface between the channel layer 1305 and the gate stack 1306), and since high strain in the channel layers 1305 is maintained. Also, nanosheet widths in accordance with embodiments of the inventive concepts may not limited by undercut etch selectivity to the nanosheet materials or by limitations of metal fill of undercut regions, in contrast to some conventional nanosheets formed by an undercut etch of one nanosheet material relative to the other nanosheet material followed by metal refill of the undercut regions. Furthermore, as embodiments of the inventive concepts allow for precise control of the thin channel layers, devices described herein can be scaled to short-Lg (gate length) technologies.

Embodiments of the present inventive concepts thus provide methods for fabricating a fully crystalline multiple nanosheet strained Group IV MOSFET. Some of the operations described herein may include, but are not limited to, conventional techniques. For example, the substrate can include any semiconducting material, including, but not limited to semiconductors such as GaAs and InAs or Si-containing materials such as Si, bulk Si, single crystal Si, polycrystalline Si, SiGe, amorphous Si, silicon-on-insulator (SOI), SiGe-on-insulator (SGOI), strained-silicon-on-insulator, annealed poly-Si, and/or others. In another example, layers such as the gate dielectric layer can be formed using conventional techniques such as chemical vapor deposition (CVD), atomic layer deposition (ALD), pulsed CVD, plasma assisted CVD, sputtering, e-beam deposition, and/or solution-based deposition, and/or can be formed using a thermal growth process which may include oxidation, oxynitridation, nitridation, and/or plasma treatment.

In a further example, the gate structure can be fabricated by utilizing some conventional processes, for example, a hard mask may be formed atop the layer of semiconductor material by utilizing conventional deposition processes such as chemical vapor deposition (CVD), plasma-assisted CVD, or sputtering, and/or the hard mask may be grown on a semiconductor body utilizing a conventional thermal oxidation process, followed by a nitridation process. Patterning may be performed by utilizing conventional lithography and etching. Specifically, the lithographic process may include applying a photoresist, exposing the photoresist to a pattern of radiation, and developing the pattern into the photoresist utilizing conventional resist developer. After patterning of the photoresist, the exposed portions, for example, not protected by the patterned photoresist, may be removed utilizing an etching process that is highly selective in removing the radiation exposed portions. Suitable types of etching that can be employed in forming the patterned layer include, but are not limited to, reactive-ion etching (RIE), plasma etching (e.g. ion milling), and/or laser ablation. After this etching step, the photoresist may be removed from the structure.

In another example, a conventional implantation process may be performed so as to form source/drain implant regions in the structure in areas adjacent to, for example channel regions within a fin. The doping may be either n- or p-type. In one example, the exposed areas adjacent to the fin may be doped using different implant species, such as arsenic (As) and/or boron (B), so as to form source/drain regions which have donor or acceptor impurities, respectively.

Features of specific example embodiments of the present inventive concepts are noted below:

In one embodiment, a FET includes a fully crystalline stack of multiple crystalline Si/SiGe and insulating layers, the multiple layers forming individually-gated conduction channels.

In one embodiment, a FET includes a fully crystalline stack of multiple crystalline Si/SiGe and insulating layers, including a fully crystalline stack of multiple strained crystalline Si/SiGe and insulating layers.

In one embodiment, a FET includes a subset of the multiple strained layers forming lightly-doped crystalline conduction channels, a subset of the multiple strained layers forming undoped crystalline gate dielectrics, and a subset of the strained layers forming heavily doped crystalline gate electrodes, each crystalline conduction channel in the fully crystalline stack surrounded by a crystalline gate dielectric and crystalline first gate electrode.

In one embodiment, an nFET includes conduction channels formed of Si, the crystalline gate dielectrics formed by $CaF_2$, ZnS, $Pr_2O_3$, or $Gd_2O_3$, and the first gate electrodes comprised of SiGe.

In one embodiment, a pFET includes conduction channels formed by SiGe, the gate dielectrics formed by $CaF_2$, ZnS, $Pr_2O_3$, or $Gd_2O_3$, and the first gate electrodes comprised of Si.

In one embodiment, a FET includes a nanosheet FET, where the nanosheet FET is formed with a second gate electrode wrapping around the fully crystalline stack of multiple layers, the second gate electrode only selectively contacting the first gate electrodes, the second gate electrode and first gate electrodes forming gate-all-around structures, the gate-all-around structures fully surrounding the individually-gated conduction channels.

In one embodiment, a FET includes a second gate electrode formed of a metal or polycrystalline semiconductor.

In one embodiment, a FET includes a nanosheet FET formed with a source/drain electrode, the source/drain electrode selectively contacting the conduction channels without contacting the gate electrodes.

In one embodiment, an nFET includes a source/drain electrode formed of any of the following, but not exclusive to: Si, C, n-type dopants, and metal.

In one embodiment, a pFET includes a source/drain electrode formed of any of the following, but not exclusive to: SiGe, C, p-type dopants, and metal.

In one embodiment, a nanosheet FET includes a high mobility conduction channel, the high mobility due to substantial elimination of surface-roughness scattering in the regions above and below each conduction channel.

In one embodiment, a method of forming a nanosheet FET includes formation of a fully crystalline stack of strained layers, formation of a second gate electrode wrapping around the fully crystalline stack of multiple strained layers, the second gate electrode selectively contacting the first gate electrodes without contacting the conduction channels, and formation of a source/drain electrode selectively contacting the conduction channels without contacting the first gate electrodes.

In one embodiment, a nanosheet FET includes a SiGe layer, where the Ge % in the SiGe layer is below 100% to provide suitable strain or mobility in the channel layers without excessive defectivity, and substantially below 50% to achieve non-excessive defectivity, and substantially ≤30% to achieve non-excessive defectivity, where the Ge % in the gate regions for nFET not necessarily the same as the Ge % in the channel conduction layer for pFETs.

In one embodiment, a nanosheet FET may include an nFET device having a gate region where a range of the Ge % in the gate region allows for a mobility benefit of up to 30%-50%, depending on the layer thickness, and/or a pFET device having a high Ge % in the channel conduction region (for example, 100% for increased mobility), but band-to-band-tunneling current and the parasitic bipolar effect limit the Ge % to ~70% (or higher for VDD operation below 0.6V).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIG. 1s turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "on" or "connected" to another element, it can be directly on or connected to the other element, or intervening elements may be present. In contrast, when an element is referred to as being "directly on" or "directly connected" to another element, there are no intervening elements present. In no event, however, should "on" or "directly on" be construed as requiring a layer to completely cover an underlying layer.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the Figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods and systems for providing a strained Group IV nanosheet structure (for example, a Si/SiGe nanosheet structure) usable in field effect transistor (FET) applications, such as MOSFETs, has been described. The methods and systems have been described in accordance with the exemplary embodiments shown, and one of ordinary skill in the art will readily recognize that there could be variations to the illustrated embodiments, and any variations would be within the spirit and scope of the method and system. Accordingly, many modifications may be made by one of ordinary skill in the art without departing from the spirit and scope of the invention as described herein and defined by the following claims.

That which is claimed is:

1. A field effect transistor, comprising:
   a nanosheet stack comprising a plurality of individually gated conduction channels, the individually gated conduction channels respectively comprising a crystalline semiconductor channel layer, a crystalline dielectric layer on the crystalline semiconductor channel layer, and a crystalline semiconductor gate layer on the crystalline dielectric layer opposite the crystalline semiconductor channel layer, wherein the nanosheet stack is strained from lattice mismatch between ones of the layers thereof,
   wherein the crystalline semiconductor channel layer and the crystalline semiconductor gate layer comprise different Group IV semiconductor materials, and
   wherein the crystalline dielectric layer is not configured to supply free charge carriers to the crystalline semiconductor channel layer.

2. A field effect transistor, comprising:
   a body layer comprising a crystalline semiconductor channel region; and
   a gate stack on the crystalline semiconductor channel region, the gate stack comprising a crystalline semiconductor gate layer that is lattice mismatched with the crystalline semiconductor channel region, and a crystalline gate dielectric layer between the crystalline semiconductor gate layer and the crystalline semiconductor channel region,
   wherein the crystalline semiconductor channel region and the crystalline semiconductor gate layer comprise different Group IV semiconductor materials, and
   wherein the crystalline gate dielectric layer is not configured to supply free charge carriers to the crystalline semiconductor channel region.

3. The field effect transistor of claim 2, wherein an interface between the crystalline semiconductor channel region and the gate stack is free of amorphous materials.

4. The field effect transistor of claim 3, wherein the crystalline gate dielectric layer comprises a high-k crystalline insulating layer directly on the channel region.

5. The field effect transistor of claim 4, wherein the crystalline semiconductor gate layer is directly on the crystalline gate dielectric layer, and wherein the crystalline semiconductor channel region and the crystalline semiconductor gate layer comprise heteroepitaxial strained semiconductor layers.

6. The field effect transistor of claim 5, wherein the crystalline semiconductor gate layer is heavily doped relative to the crystalline semiconductor channel region.

7. The field effect transistor of claim 6, wherein one of the crystalline semiconductor channel region and the crystalline semiconductor gate layer comprises compressively strained silicon germanium (SiGe), and another of the crystalline semiconductor channel region and the crystalline semiconductor gate layer comprises tensile strained silicon (Si).

8. The field effect transistor of claim 5, wherein the crystalline semiconductor gate layer comprises respective crystalline semiconductor gate layers on opposing surfaces of the crystalline semiconductor channel region, and wherein the crystalline gate dielectric layer comprises respective crystalline gate dielectric layers between the respective crystalline semiconductor gate layers and the opposing surfaces of the crystalline semiconductor channel region.

9. The field effect transistor of claim 8, wherein a structure comprising the gate stack and the body layer is repeatedly stacked to define a plurality of individually-gated channel regions, and wherein strain in the individually-gated channel regions and the respective crystalline semiconductor gate layers is maintained throughout the structure.

10. The field effect transistor of claim 9, wherein the respective crystalline semiconductor gate layers on the opposing surfaces of the crystalline semiconductor channel region comprise primary gate layers, and further comprising:
a secondary gate layer on sidewalls of the crystalline semiconductor channel region between the opposing surfaces thereof,
wherein the secondary gate layer comprises a metal or doped polycrystalline material.

11. The field effect transistor of claim 10, wherein the plurality of individually-gated channel regions define a fin protruding from a substrate, and wherein the secondary gate layer extends on opposing sidewalls of the fin and on a surface therebetween.

12. The field effect transistor of claim 10, further comprising:
amorphous insulating layers separating the sidewalls of the crystalline semiconductor channel region from the secondary gate layer,
wherein the secondary gate layer is conductively coupled to the primary gate layers.

13. The field effect transistor of claim 2, further comprising:
source/drain regions on opposite ends of and conductively coupled to the crystalline semiconductor channel region adjacent the gate stack thereon; and
amorphous insulating layers separating opposing sidewalls of the crystalline semiconductor gate layer from the source/drain regions.

14. A field effect transistor, comprising:
a nanosheet stack comprising a plurality of individually gated conduction channels, the individually gated conduction channels respectively comprising a crystalline semiconductor channel layer, a crystalline dielectric layer on the crystalline semiconductor channel layer, and a crystalline semiconductor gate layer on the crystalline dielectric layer opposite the crystalline semiconductor channel layer, wherein the nanosheet stack is strained from lattice mismatch between ones of the layers thereof and has a width of greater than about 30 nanometers but less than about 100 nanometers,
wherein one of the crystalline semiconductor channel layer and the crystalline semiconductor gate layer comprises compressively strained silicon germanium (SiGe), and another of the crystalline semiconductor channel layer and the crystalline semiconductor gate layer comprises tensile strained silicon (Si), and
wherein the crystalline dielectric layer is not configured to supply free charge carriers to the crystalline semiconductor channel layer.

15. The field effect transistor of claim 14, wherein the crystalline semiconductor channel layer, the crystalline dielectric layer, and the crystalline semiconductor gate layer comprise heteroepitaxial layers.

16. The field effect transistor of claim 14, wherein the field effect transistor is an n-type device, and wherein the crystalline semiconductor channel layer comprises silicon (Si).

17. The field effect transistor of claim 14, wherein the field effect transistor is a p-type device, and wherein the crystalline semiconductor channel layer comprises silicon germanium (SiGe).

18. The field effect transistor of claim 14, wherein the crystalline dielectric layer comprises calcium fluoride ($CaF_2$), zinc sulfide (ZnS), praseodymium oxide ($Pr_2O_3$), and/or gadolinium oxide ($Gd_2O_3$).

19. The field effect transistor of claim 14, wherein the field effect transistor is an n-type device, and wherein the crystalline semiconductor gate layer comprises doped silicon germanium (SiGe).

20. The field effect transistor of claim 14, wherein the field effect transistor is a p-type device, and wherein the crystalline semiconductor gate layer comprises doped silicon (Si).

* * * * *